(12) United States Patent
Oh et al.

(10) Patent No.: US 10,923,420 B2
(45) Date of Patent: Feb. 16, 2021

(54) SEMICONDUCTOR DEVICE INCLUDING DUMMY CONTACT

(71) Applicant: Samsung Electronics Co., Ltd., Suwon-si (KR)

(72) Inventors: In Wook Oh, Suwon-si (KR); Dong Hyun Kim, Hwaseong-si (KR); Doo Hwan Park, Yongin-si (KR); Sung Keun Park, Goyang-si (KR); Chul Hong Park, Seongnam-si (KR); Sung Wook Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 7 days.

(21) Appl. No.: 15/873,352

(22) Filed: Jan. 17, 2018

(65) Prior Publication Data
US 2019/0051600 A1 Feb. 14, 2019

(30) Foreign Application Priority Data
Aug. 11, 2017 (KR) .................. 10-2017-0102492

(51) Int. Cl.
| | |
|---|---|
| *H01L 23/528* | (2006.01) |
| *H01L 23/522* | (2006.01) |
| *H01L 21/768* | (2006.01) |
| *H01L 21/311* | (2006.01) |
| *H01L 23/532* | (2006.01) |
| *H01L 21/285* | (2006.01) |

(52) U.S. Cl.
CPC .... *H01L 23/5283* (2013.01); *H01L 21/31122* (2013.01); *H01L 21/7684* (2013.01); *H01L 21/76804* (2013.01); *H01L 21/76805* (2013.01); *H01L 21/76816* (2013.01); *H01L 21/76832* (2013.01); *H01L 23/5226* (2013.01); *H01L 21/28568* (2013.01); *H01L 21/76846* (2013.01); *H01L 21/76852* (2013.01); *H01L 23/53238* (2013.01); *H01L 23/53295* (2013.01)

(58) Field of Classification Search
CPC ...................................................... H01L 21/28
USPC ......................................... 257/774; 438/637
See application file for complete search history.

(56) References Cited

U.S. PATENT DOCUMENTS

| | | | |
|---|---|---|---|
| 6,407,464 B1 * | 6/2002 | Terauchi | H01L 21/76819 257/296 |
| 6,468,894 B1 | 10/2002 | Yang et al. | |
| 6,589,711 B1 * | 7/2003 | Subramanian | H01L 21/76808 257/E21.579 |
| 6,958,547 B2 * | 10/2005 | Dubin | H01L 21/288 257/758 |

(Continued)

FOREIGN PATENT DOCUMENTS

KR 10-2005-0007630 A 1/2005

*Primary Examiner* — Sheng-Bai Zhu
(74) *Attorney, Agent, or Firm* — Harness, Dickey & Pierce, P.L.C.

(57) ABSTRACT

A semiconductor device includes a plurality of main contact plugs and a plurality of dummy contact plugs which pass through an insulating layer on a substrate. A plurality of upper interconnections is on the insulating layer. The plurality of dummy contact plugs include a first dummy contact plug. The plurality of upper interconnections include a first upper interconnection overlapping the first dummy contact plug. A vertical central axis of the first dummy contact plug is located outside the first upper interconnection.

20 Claims, 19 Drawing Sheets

(56) References Cited

U.S. PATENT DOCUMENTS

| | | |
|---|---|---|
| 7,812,405 B2 | 10/2010 | Suzuki |
| 8,441,041 B2 | 5/2013 | Fang et al. |
| 8,455,359 B2 | 6/2013 | Kim et al. |
| 9,343,463 B2 | 5/2016 | Zhong et al. |
| 2002/0168849 A1* | 11/2002 | Lee ................... H01L 21/31111 438/637 |
| 2003/0203509 A1* | 10/2003 | Rizzo ..................... B82Y 10/00 438/3 |
| 2004/0119164 A1* | 6/2004 | Kurashima ....... H01L 21/76832 257/758 |
| 2004/0132262 A1* | 7/2004 | Ayabe ............... H01L 27/14603 438/428 |
| 2005/0110130 A1* | 5/2005 | Kitabayashi .......... G06F 30/394 257/698 |
| 2005/0280152 A1* | 12/2005 | Fitzsimmons .... H01L 21/76805 257/750 |
| 2007/0108618 A1* | 5/2007 | Hasunuma ........ H01L 21/76832 257/758 |
| 2008/0150138 A1* | 6/2008 | Bright ............... H01L 21/76846 257/751 |
| 2009/0163020 A1 | 6/2009 | Ryu |
| 2010/0237477 A1* | 9/2010 | Pagaila ................. H01L 21/561 257/660 |
| 2010/0244254 A1* | 9/2010 | Kobayashi .......... H01L 23/5226 257/751 |
| 2012/0196439 A1* | 8/2012 | Kim ..................... H01L 23/522 438/672 |
| 2012/0298410 A1* | 11/2012 | Lu .................... H01L 23/49827 174/264 |
| 2013/0147013 A1* | 6/2013 | Ode ................. H01L 27/10852 257/532 |
| 2013/0284885 A1* | 10/2013 | Chen ....................... H01L 25/16 250/208.1 |
| 2015/0171007 A1* | 6/2015 | Huang ................ H01L 23/5329 257/774 |
| 2016/0093572 A1* | 3/2016 | Chen ....................... H01L 24/97 257/774 |
| 2017/0098575 A1* | 4/2017 | Kesapragada .... H01L 21/76826 |
| 2017/0309514 A1* | 10/2017 | Rainville .......... H01L 21/76834 |

* cited by examiner

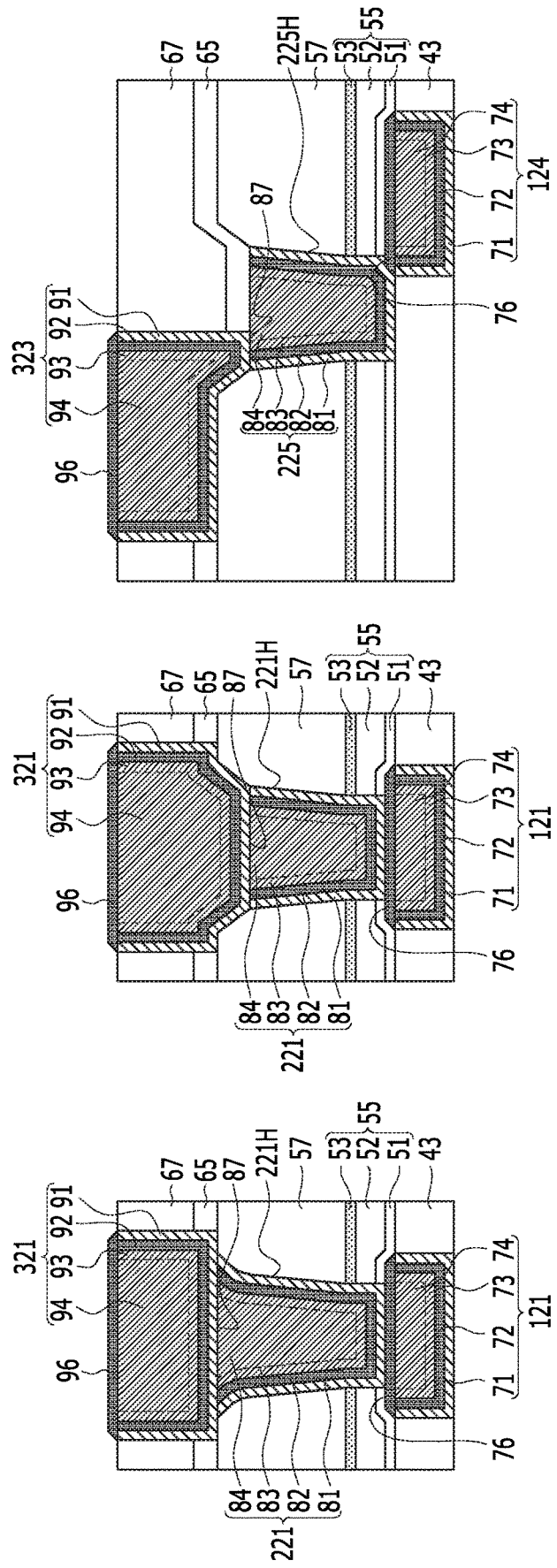

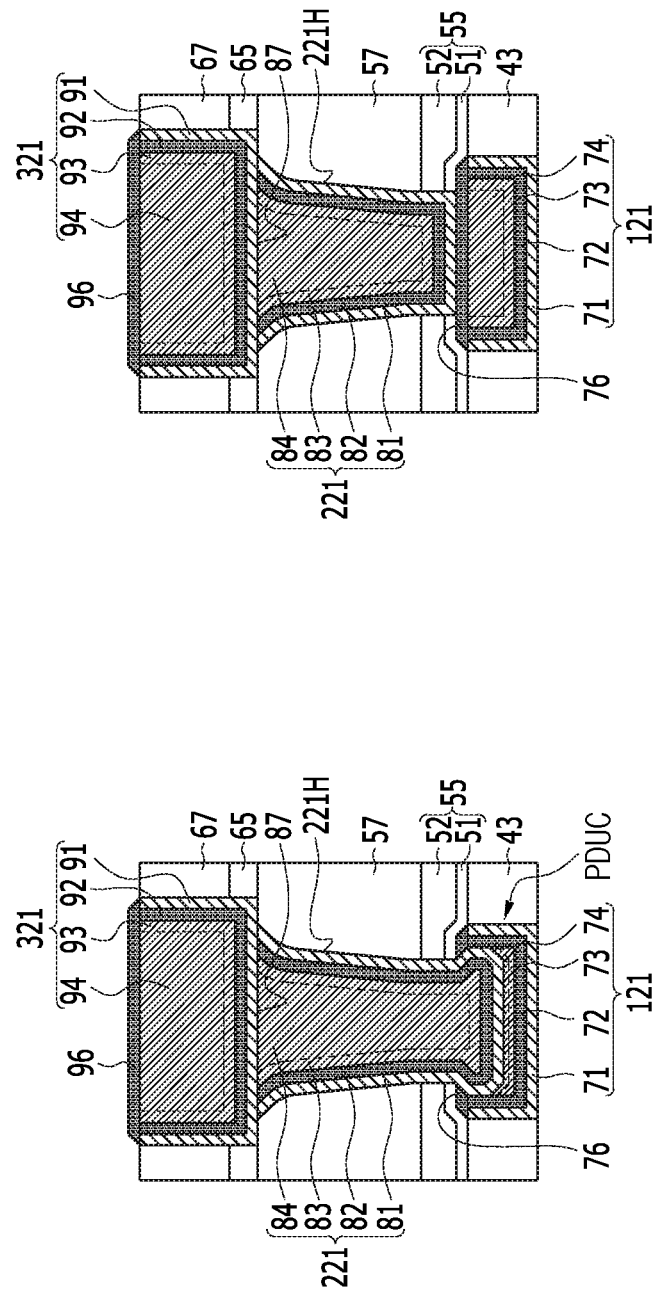

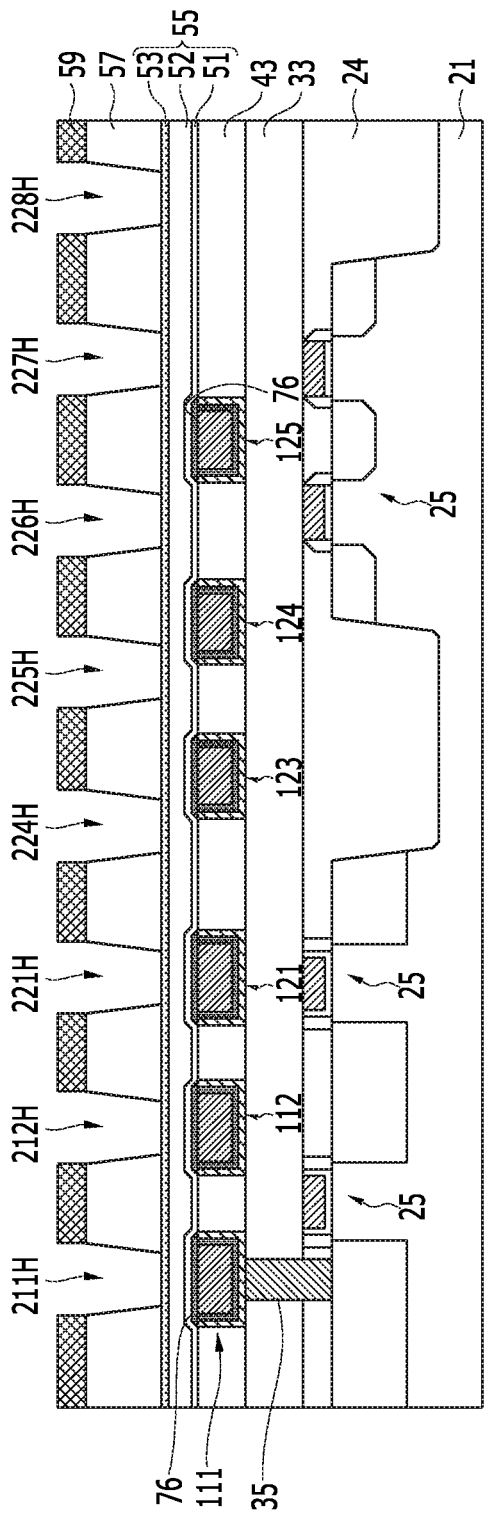

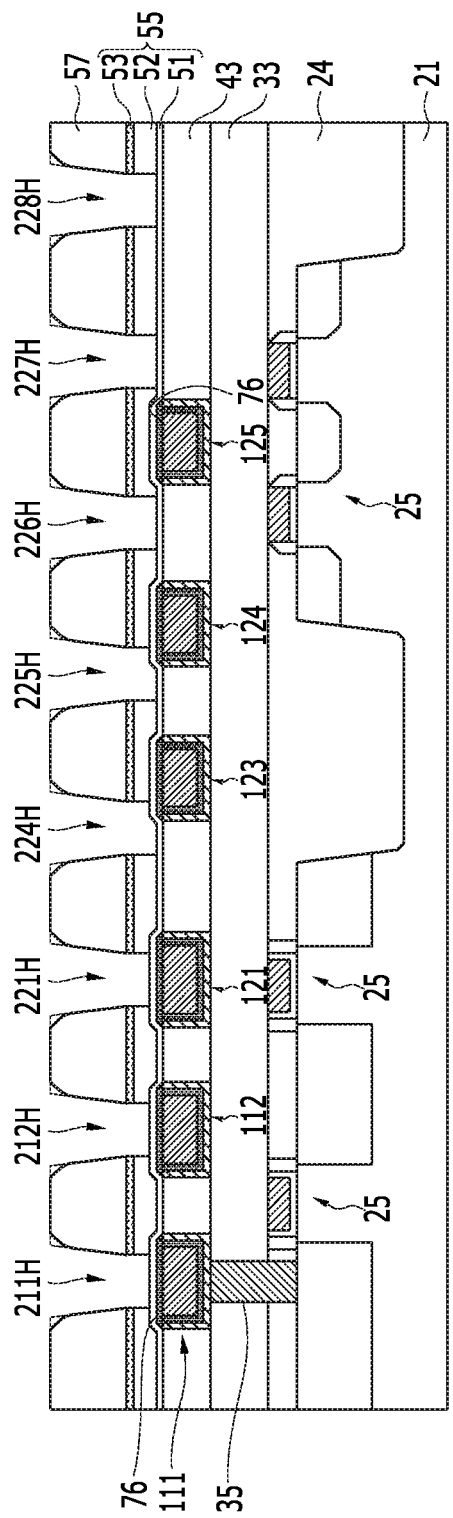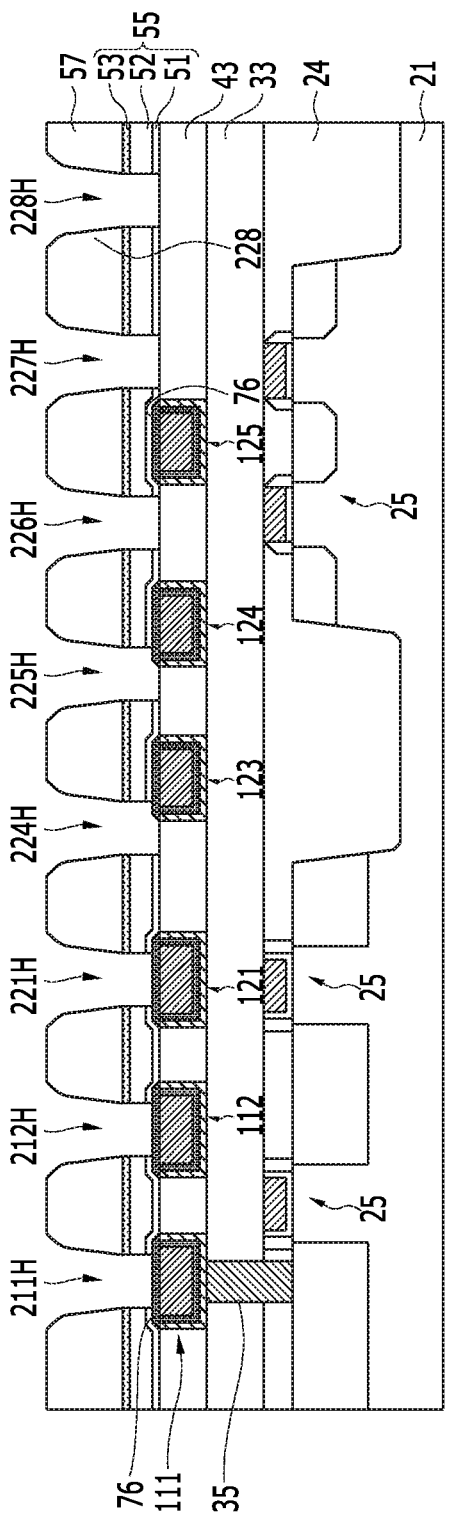

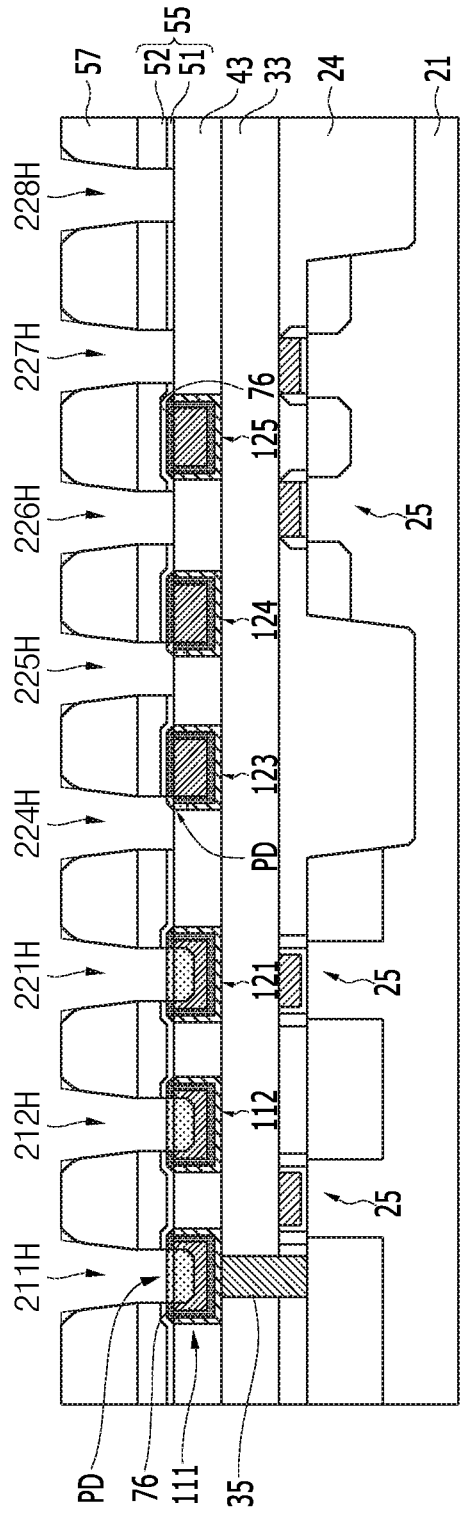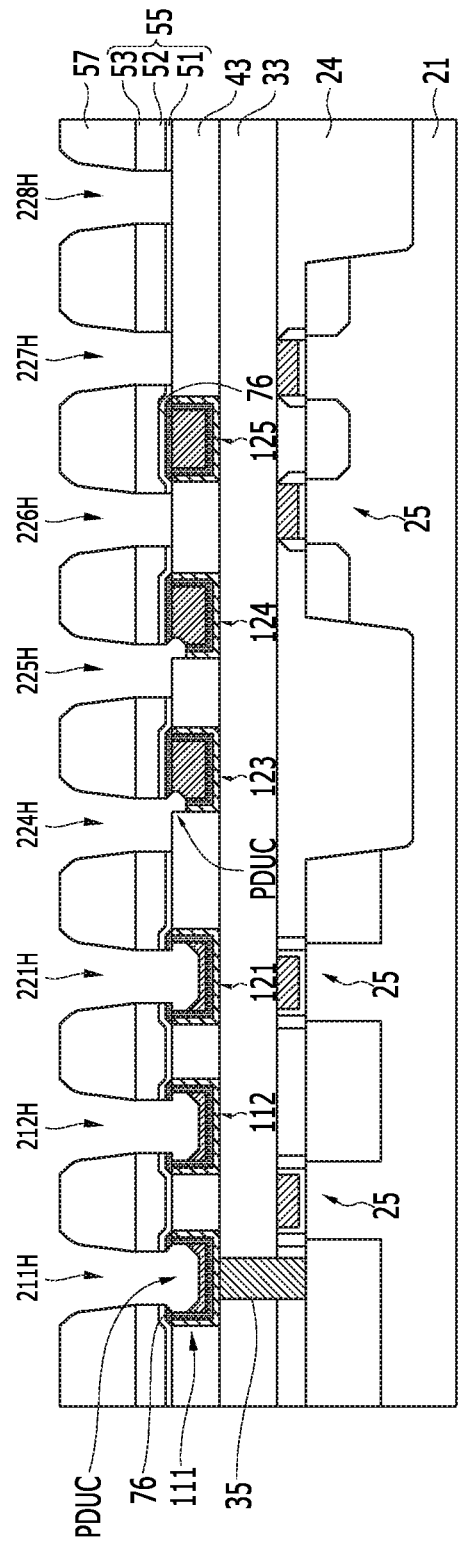

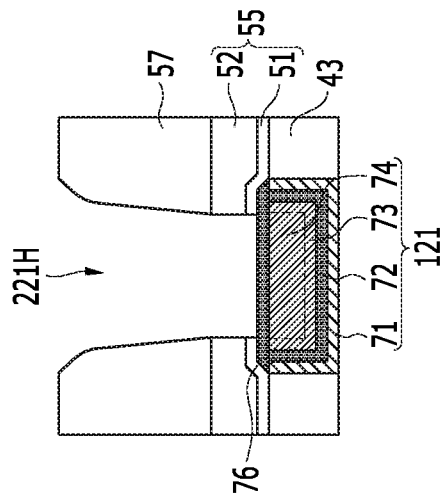
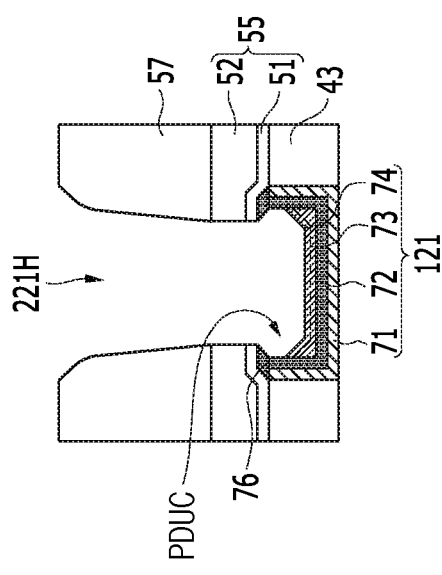
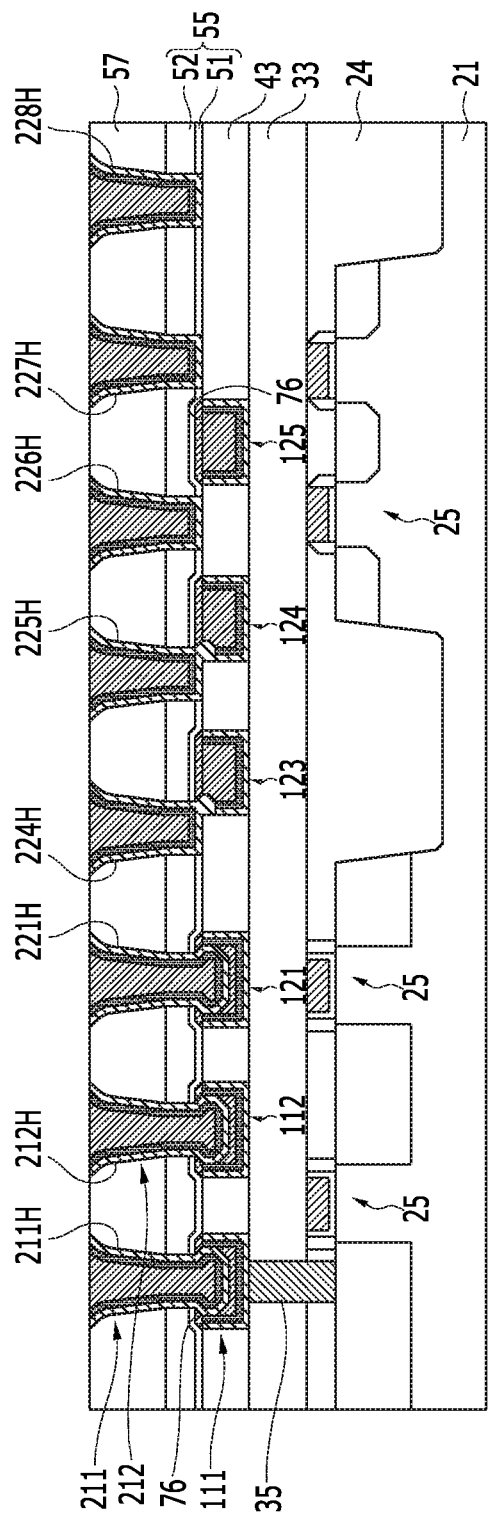

SEMICONDUCTOR DEVICE INCLUDING DUMMY CONTACT

CROSS-REFERENCE TO RELATED APPLICATION

This U.S. non-provisional patent application claims priority under 35 U.S.C. § 119 to and the benefit of Korean Patent Application No. 10-2017-0102492, filed on Aug. 11, 2017, in the Korean intellectual Property Office (KIPO), the disclosure of which is incorporated herein by reference in its entirety.

BACKGROUND

Inventive concepts relate to a semiconductor device including a dummy contact plug.

A process of forming contact plugs and interconnections is becoming increasingly difficult, for example owing to high integration of semiconductor devices. A single damascene process has been attempted to form the contact plugs. The single damascene process may generate various defects, such as dishing, due to the arrangement of the contact plugs. A new technique is desired to optimize or improve the arrangement of the contact plugs.

SUMMARY OF THE INVENTION

Inventive concepts are directed to providing a semiconductor device which is advantageous for reducing defects in an interconnection process and achieving high integration.

Inventive concepts are directed to providing a method of forming a semiconductor device which is advantageous for reducing defects in an interconnection process and achieving high integration.

A semiconductor device according to example embodiments of inventive concepts includes a plurality of main contact plugs and a plurality of dummy contact plugs passing through an insulating layer on the substrate. A plurality of upper connections is on the insulating layer. The plurality of dummy contact plugs include a first dummy contact plug. The plurality of upper interconnections include a first upper interconnection overlapping the first dummy contact plug. A vertical central axis of the first dummy contact plug is located outside the first conductive pattern.

A semiconductor device according to example embodiments of inventive concepts includes a first insulating layer on a substrate. A plurality of lower interconnections is inside the first insulating layer. An etch stop layer is formed on the first insulating layer and the plurality of lower interconnections. A second insulating layer is on the etch stop layer. A plurality of main contact plugs and a plurality of dummy contact plugs passing through the second insulating layer and the etch stop layer, are formed. A plurality of upper interconnections is on the second insulating layer. The plurality of dummy contact plugs include a first dummy contact plug. The plurality of upper interconnections include a first upper interconnection overlapping the first dummy contact plug. A vertical central axis of the first dummy contact plug is located outside the first upper conductive pattern.

A semiconductor device according to example embodiments of inventive concepts includes a first insulating layer on a substrate. A plurality of lower interconnections is inside the first insulating layer. An etch stop layer is on the first insulating layer and the plurality of lower interconnections. A second insulating layer is on the etch stop layer. A plurality of main contact plugs and a plurality of dummy contact plugs pass through the second insulating layer and the etch stop layer. A plurality of upper interconnections is on the second insulating layer. The etch stop layer includes a first etch stop layer on the first insulating layer and the plurality of lower interconnections patterns, a second etch stop layer on the first etch stop layer, and a third etch stop layer on the second etch stop layer. The third etch stop layer includes a material having etch selectivity with respect to the second insulating layer. The second etch stop layer includes a material having etch selectivity with respect to the third etch stop layer. The first etch stop layer includes a material having etch selectivity with respect to the second etch stop layer and the plurality of lower interconnections.

BRIEF DESCRIPTION OF THE DRAWINGS

The above and other objects, features and advantages of inventive concepts will become more apparent to those of ordinary skill in the art by describing example embodiments thereof in detail with reference to the accompanying drawings, in which:

FIGS. 2 to 10 are partially enlarged views illustrating a part of FIG. 1;

FIGS. 12 and 13 are partially enlarged views illustrating a part of FIG. 11;

FIGS. 16 to 20 and 27 to 30 are cross-sectional views for describing a method of forming a semiconductor device according to example embodiments of inventive concepts;

FIGS. 31 to 36, 39, and 40 are cross-sectional views for describing a method of forming a semiconductor device according to example embodiments of inventive concepts; and FIGS. 37 and 38 are partially enlarged views illustrating a part of FIG. 36.

DETAILED DESCRIPTION OF EXAMPLE EMBODIMENTS

A process of forming contact plugs using a single damascene process may cause various defects during a chemical mechanical polishing (CMP) process due, for example, to the density, gaps, and/or shapes of contact holes/plugs. In order to achieve more uniform density and gaps of the contact plugs on an entire substrate, dummy contact plugs may be around main contact plugs. Arrangement of the main contact plugs and the dummy contact plugs may be directly affected by upper and lower interconnections.

The main contact plug may serve to exchange signals between the upper interconnection and the lower interconnection. A wide contact area of the upper interconnection and the contact plug may be advantageous for transmission of a signal. Expanding an upper region of the contact hole for reducing contact resistance between the contact plug and the upper interconnection may be advantageous. A structure capable of minimizing or reducing a leakage current may be advantageous for a contact region of the contact plug and the lower interconnection. A technique for protecting a lower structure of the contact hole from damage during a process of expanding the upper region of the contact hole may be required or desired. Simultaneously forming the dummy contact plugs and the main contact plugs to have the same shape may be advantageous.

Figure 1:
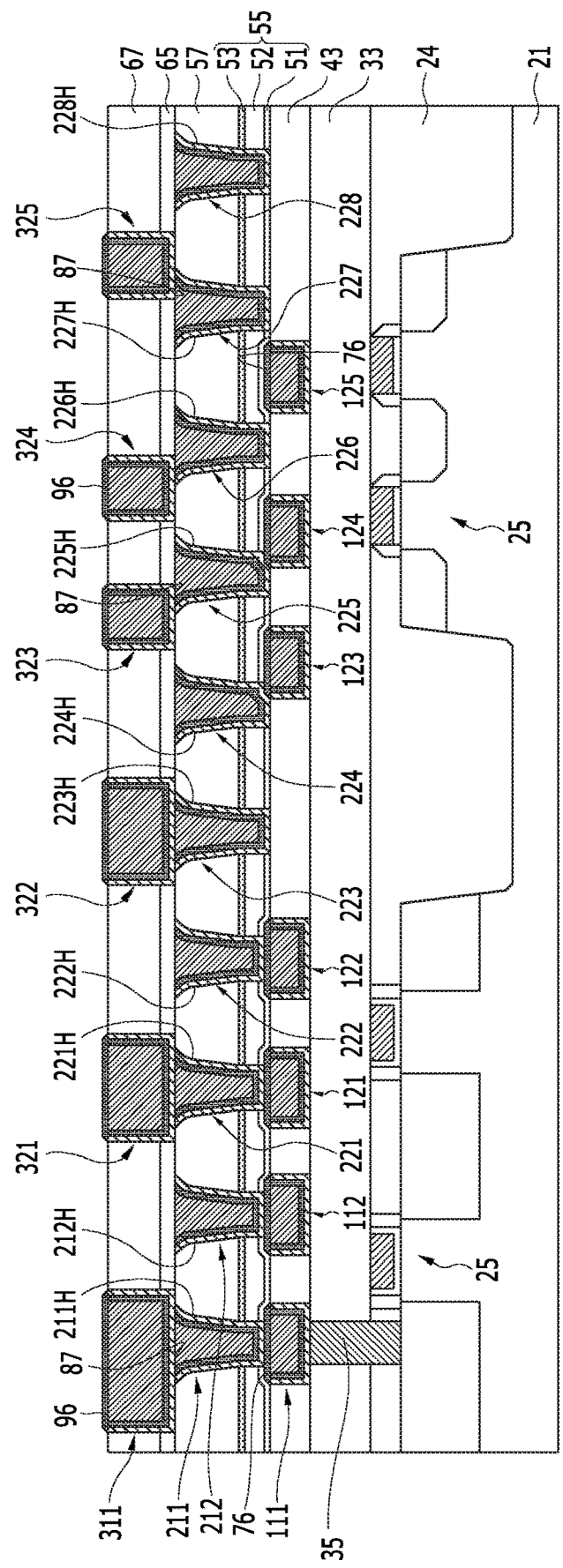
FIG. 1 is a cross-sectional view for describing a semiconductor device including dummy contact plugs according to example embodiments of inventive concepts.

FIG. 1 is a cross-sectional view for describing a semiconductor device including dummy contact plugs according to example embodiments of inventive concepts, and FIGS. 2 to 10 are partially enlarged views illustrating a part of FIG. 1.

Referring to FIG. 1, the semiconductor device according to the embodiments of inventive concepts semiconductor device may include a substrate 21, a lower insulating layer 24, a plurality of active/passive devices 25, a first insulating interlayer 33, a lower plug 35, a second insulating interlayer 43, a lower etch stop layer 55, a third insulating interlayer 57, an upper etch stop layer 65, a fourth insulating interlayer 67, lower capping patterns 76, upper capping patterns 96, lower interconnections 111, 112, 121, 122, 123, 124, and 125, contact holes 211H, 212H, 221H, 222H, 223H, 224H, 225H, 226H, 227H, and 228H, contact plugs 211, 212, 221, 222, 223, 224, 225, 226, 227, and 228, and upper interconnections 311, 321, 322, 323, 324, and 325. The lower etch stop layer 55 may include a first etch stop layer 51, a second etch stop layer 52, and a third etch stop layer 53.

In one example embodiment, each of the contact holes 211H, 212H, 221H, 222H, 223H, 224H, 225H, 226H, 227H, and 228H may correspond to a via hole. Each of the contact plugs 211, 212, 221, 222, 223, 224, 225, 226, 227, and 228 may correspond to a via plug.

The lower interconnections 111, 112, 121, 122, 123, 124, and 125 may include a first lower main interconnection 111, a second lower main interconnection 112, a first lower dummy interconnection 121, a second lower dummy interconnection 122, a third lower dummy interconnection 123, a fourth lower dummy interconnection 124, and a fifth lower dummy interconnection 125. The contact holes 211H, 212H, 221H, 222H, 223H, 224H, 225H, 226H, 227H, and 228H may include a first main contact hole 211H, a second main contact hole 212H, a first dummy contact hole 221H, a second dummy contact hole 222H, a third dummy contact hole 223H, a fourth dummy contact hole 224H, a fifth dummy contact hole 225H, a sixth dummy contact hole 226H, a seventh dummy contact hole 227H, and an eighth dummy contact hole 228H. The contact plugs 211, 212, 221, 222, 223, 224, 225, 226, 227, and 228 may include a first main contact plug 211, a second main contact plug 21 first dummy contact plug 221, a second dummy contact plug 222, a third dummy contact plug 223, a fourth dummy contact plug 224, a fifth dummy contact plug 225, a sixth dummy contact plug 226, a seventh dummy contact plug 227, and an eighth dummy contact plug 228. The upper interconnections 311, 321, 322, 323, 324, and 325 may include an upper main interconnection 311, a first upper dummy interconnection 321, a second upper dummy interconnection 322, a third upper dummy interconnection 323, a fourth upper dummy interconnection 324, and a fifth upper dummy interconnection 325.

Interfaces 87 may be formed between the first main contact plug 211 and the upper main interconnection 311, between the first dummy contact plug 221 and the first upper dummy interconnection 321, between the third dummy contact plug 223 and the second upper dummy interconnection 322, between the fifth dummy contact plug 225 and the third upper dummy interconnection 323, between the sixth dummy contact plug 226 and the fourth upper dummy interconnection 324, and between the seventh dummy contact plug 227 and the fifth upper dummy interconnection 325.

Referring to FIG. 2, the first lower dummy interconnection 121 may include a first lower barrier layer 71, a second lower barrier layer 72, a lower seed layer 73, and a lower conductive layer 74. The first lower barrier layer 71 may surround side surfaces and bottoms of the second lower barrier layer 72, the lower seed layer 73, and the lower conductive layer 74. The lower capping pattern 76 may be formed on the first lower dummy interconnection 121. The first dummy contact plug 221 may include a first contact barrier layer 81, a second contact barrier layer 82, a contact seed layer 83, and a contact conductive layer 84. The first contact barrier layer 81 may surround side surfaces and bottoms of the second contact barrier layer 82, the contact seed layer 83, and the contact conductive layer 84. The lower capping pattern 76 may be between the first lower dummy interconnection 121 and the first dummy contact plug 221. The first contact barrier layer 81 may be in contact with, e.g. in direct contact with, the lower capping pattern 76.

The first upper dummy interconnection 321 may include a first upper barrier layer 91, a second upper barrier layer 92, an upper seed layer 93, and an upper conductive layer 94. The first upper barrier layer 91 may surround side surfaces and bottoms of the second upper barrier layer 92, the upper seed layer 93, and the upper conductive layer 94. The interface 87 may be formed between the first dummy contact plug 221 and the first upper dummy interconnection 321. The first upper barrier layer 91 may be in contact with, e.g. in direct contact with, an upper surface of the first dummy contact plug 221. The upper capping pattern 96 may be formed on the first upper dummy interconnection 321.

Referring again to FIGS. 1 and 2, each of the lower interconnections 111, 112, 121, 122, 123, 124, and 125 may include the first lower barrier layer 71, the second lower barrier layer 72, the lower seed layer 73, and the lower conductive layer 74. Each of the contact plugs 211, 212, 221, 222, 223, 224, 225, 226, 227, and 228 may include the first contact barrier layer 81, the second contact barrier layer 82, the contact seed layer 83, and the contact conductive layer 84. Each of the upper interconnections 311, 321, 322, 323, 324, and 325 may include the first upper barrier layer 91, the second upper barrier layer 92, the upper seed layer 93, and the upper conductive layer 94.

The first main contact plug 211 may overlap the first lower main interconnection 111 and the upper main interconnection 311. The second main contact plug 212 may overlap the second lower main interconnection 112. The first dummy contact plug 221 may overlap the first lower dummy interconnection 121 and the first upper dummy interconnection 321. Vertical central axes may be axes perpendicular to a surface of the substrate 21. Accordingly, a vertical central axis of the first dummy contact plug 221 may overlap the first lower dummy interconnection 121 and the first upper dummy interconnection 321. The second dummy contact plug 222 may overlap the second lower dummy interconnection 122. In one example embodiment, the second lower dummy interconnection 122 may correspond to a lower main interconnection. The third dummy contact plug 223 may overlap the second upper dummy interconnection 322.

In one example embodiment, the second upper dummy interconnection 322 may correspond to an upper main interconnection.

The fourth dummy contact plug 224 may partially overlap the third lower dummy interconnection 123. A vertical central axis of the fourth dummy contact plug 224 may be located outside the third lower dummy interconnection 123. An overlapping area of the fourth dummy contact plug 224 and the third lower dummy interconnection 123 may be less than 0.5 times an area of a lower surface of the fourth dummy contact plug 224. In one example embodiment, the third lower dummy interconnection 123 may correspond to a lower main interconnection. The fifth dummy contact plug 225 may partially overlap the fourth lower dummy interconnection 124 and the third upper dummy interconnection 323. A vertical central axis of the fifth dummy contact plug 225 may be located outside the fourth lower dummy interconnection 124. An overlapping area of the fifth dummy contact plug 225 and the fourth lower dummy interconnection 124 may be less than 0.5 times an area of a lower surface of the fifth dummy contact plug 225. The vertical central axis of the fifth dummy contact plug 225 may be located outside the third upper dummy interconnection 323. An overlapping area of the fifth dummy contact plug 225 and the third upper dummy interconnection 323 may be less than 0.5 times an area of an upper surface of the fifth dummy contact plug 225.

The sixth dummy contact plug 226 may partially overlap the fourth upper dummy interconnection 324. A vertical central axis of the sixth dummy contact plug 226 may be located outside the fourth upper dummy interconnection 324. An overlapping area of the sixth dummy contact plug 226 and the fourth upper dummy interconnection 324 may be less than 0.5 times an area of an upper surface of the sixth dummy contact plug 226. In one example embodiment, the fourth upper dummy interconnection 324 may correspond to an upper main interconnection. The seventh dummy contact plug 227 may partially overlap the fifth upper dummy interconnection 325. A vertical central axis of the seventh dummy contact plug 227 may be located outside the fifth upper dummy interconnection 325. An overlapping area of the seventh dummy contact plug 227 and the fifth upper dummy interconnection 325 may be less than 0.5 times an area of an upper surface of the seventh dummy contact plug 227. In one example embodiment, the fifth upper dummy interconnection 325 may correspond to an upper main interconnection. The eighth dummy contact plug 228 may be interpreted as not overlapping with the lower interconnections 111, 112, 121, 122, 123, 124, and 125 and the upper interconnections 311, 321, 322, 323, 324, and 325.

The fourth dummy contact plug 224, the fifth dummy contact plug 225, the sixth dummy contact plug 226, the seventh dummy contact plug 227, and the eighth dummy contact plug 228 may be interpreted as off-axis dummy contact plugs. In adjacent regions on the substrate 21, density, gaps, and shapes of the contact plugs 211, 212, 221, 222, 223, 224, 225, 226, 227, and may be the same, or substantially the same.

Upper surfaces of the contact plugs 211, 212, 221, 222, 223, 224, 225, 226, 227, and 228 and the third insulating interlayer 57 may be coplanar, or substantially coplanar. An upper surface of the interfaces 87 and the upper surface of the third insulating interlayer 57 may be coplanar, or substantially coplanar. The lower capping patterns 76 may be between the first lower main interconnection 111, the second lower main interconnection 112, the first lower dummy interconnection 121, the second lower dummy interconnection 122, the third lower dummy interconnection 123, the fourth lower dummy interconnection 124, the first main contact plug 211, the second main contact plug 212, the first dummy contact plug 221, the second dummy contact plug 222, the fourth dummy contact plug 224, and the fifth dummy contact plug 225.

Referring to FIG. 3, the upper surface of the first dummy contact plug 221 may be recessed downward, e.g. towards a surface of a substrate. The upper surface of the first dummy contact plug 221 may be formed at a lower level than an upper end of the third insulating interlayer 57. The first upper dummy interconnection 321 may be in contact with the upper surface of the first dummy contact plug 221. A lower end of the first upper dummy interconnection 321 may be formed at a lower level than the upper end of the third insulating interlayer 57. The first upper barrier layer 91 may be in contact with, e.g. in direct contact with, the upper surface of the first dummy contact plug 221. The interface 87 between the first dummy contact plug 221 and the first upper dummy interconnection 321 may be formed at a lower level than the upper end of the third insulating interlayer 57. The contact plugs 211, 212, 221, 222, 223, 224, 225, 226, 227, and 228 and the upper interconnections 311, 321, 322, 323, 324, and 325 may have shapes similar to the first dummy contact plug 221 and the first upper dummy interconnection 321.

Referring to FIG. 4, the vertical central axis of the fifth dummy contact plug 225 may be located outside the fourth lower dummy interconnection 124, and the vertical central axis of the fifth dummy contact plug 225 may be located outside the third upper dummy interconnection 323. The upper surface of the fifth dummy contact plug 225 may be recessed downward, e.g. towards a surface of a substrate. The upper surface of the fifth dummy contact plug 225 may be formed at a lower level than the upper end of the third insulating interlayer 57. The first upper barrier layer 91 may be in contact with, e.g. in direct contact with, the upper surface of the fifth dummy contact plug 225. The interface 87 between the fifth dummy contact plug 225 and the third upper dummy interconnection 323 may be formed at a lower level than the upper end of the third insulating interlayer 57.

Figure 5:
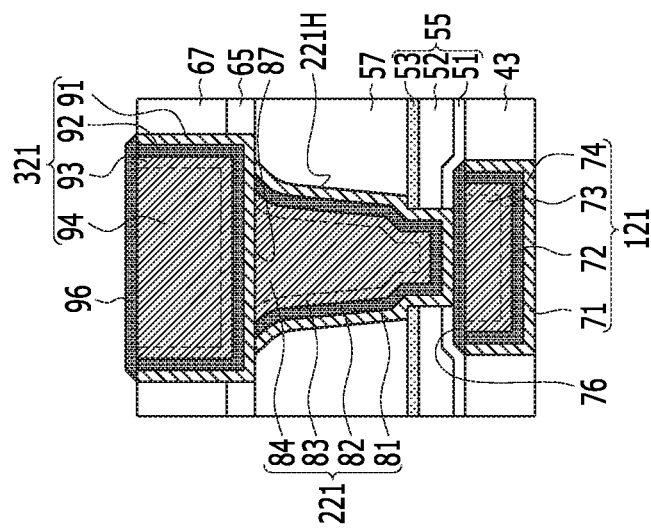

Referring to FIG. 5, a via capping pattern 86 may be formed on the first dummy contact plug 221. The via capping pattern 86 may be between the first dummy contact plug 221 and the first upper dummy interconnection 321. The first upper barrier layer 91 may be in contact with, e.g. in direct contact with, the via capping pattern 86.

Figure 6:
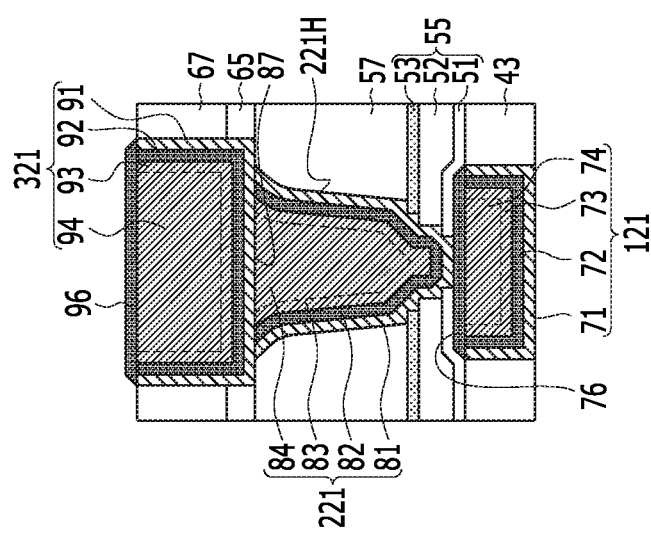

Referring to FIG. 6, in one example embodiment, the lower etch stop layer 55 may protrude in a lateral direction and have a stepped shape in a lower region of the first dummy contact hole 221H. For example, a lateral width of the first dummy contact plug 221 in a region through which the third etch stop layer 53 passes may be less than a lateral width of the first dummy contact plug 221 in a region through which the third insulating interlayer 57 passes. A lateral width of the first dummy contact plug 221 in a region through which the second etch stop layer 52 passes may be less than the lateral width of the first dummy contact plug 221 in the region through which the third etch stop layer 53 passes. A lateral width of the first dummy contact plug 221 in a region through which the first etch stop layer 51 passes may be less than the lateral width of the first dummy contact plug 221 in the region through which the second etch stop layer 52 passes. An upper surface of the third etch stop layer 53 may laterally protrude toward inside of the first dummy contact hole 221H rather than toward a side surface of the third insulating interlayer 57. The first etch stop layer 51, the second etch stop layer 52, and the third etch stop layer 53 may have a stepped shape in the first dummy contact hole 221H.

Figure 7:
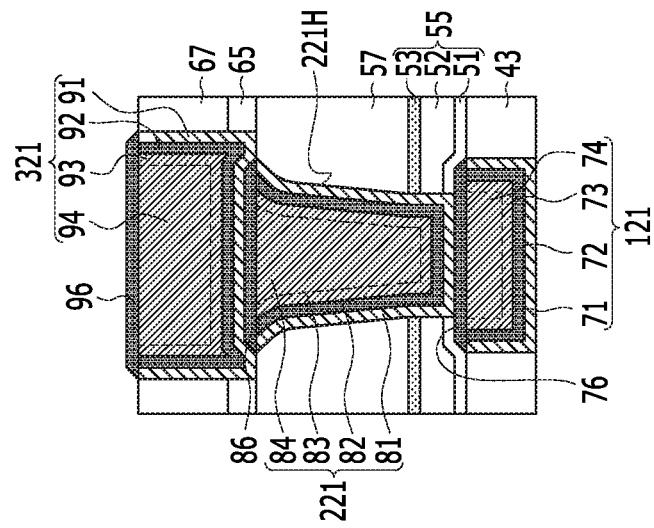

Referring to FIG. 7, in the lower region of the first dummy contact hole 221H, the lower etch stop layer 55 may protrude in the lateral direction. A lateral width of the first dummy contact plug 221 in a region through which the lower etch stop layer 55 passes may be less than the lateral width of the first dummy contact plug 221 in the region through which the third insulating interlayer 57 passes. The upper surface of the third etch stop layer 53 may laterally protrude toward the inside of the first dummy contact hole 221H rather than toward the side surface of the third insulating interlayer 57.

Figure 8:
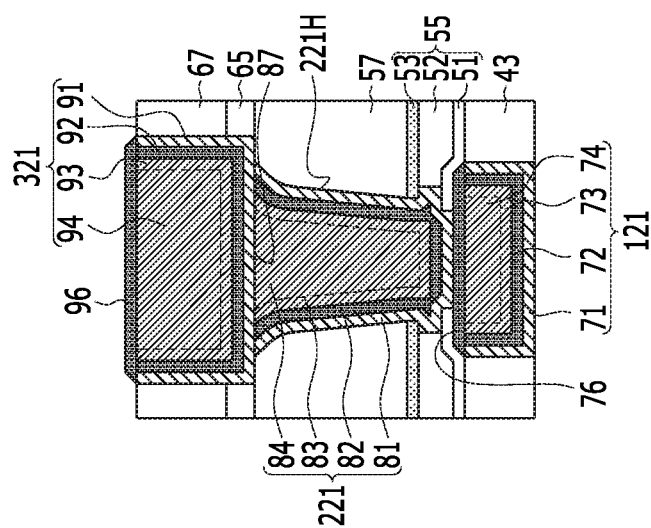

Referring to FIG. 8, the upper surface of the third etch stop layer 53 may laterally protrude toward the inside of the first dummy contact hole 221H rather than toward the side surface of the third insulating interlayer 57. An upper surface of the second etch stop layer 52 may laterally protrude toward the inside of the first dummy contact hole 221H rather than toward a side surface of the third etch stop layer 53.

Figure 9:
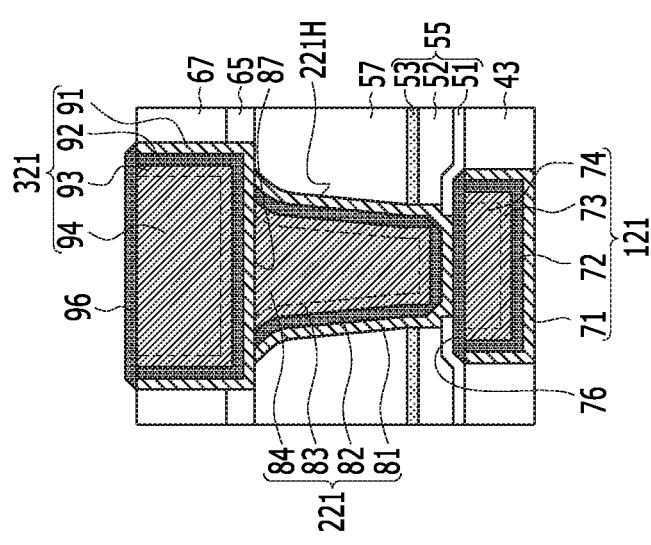

Referring to FIG. 9, an upper surface of the first etch stop layer 51 may laterally protrude toward the inside of the first dummy contact hole 221H rather than toward a side surface of the second etch stop layer 52.

Figure 10:
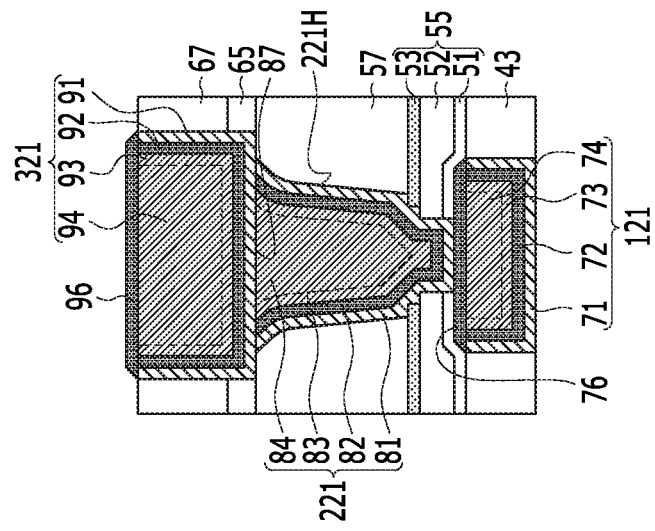

Referring to FIG. 10, the lateral width of the first dummy contact plug 221 in the region through which the second etch stop layer 52 passes may be greater than the lateral width of the first dummy contact plug 221 in the region through which the third etch stop layer 53 passes. The lateral width of the first dummy contact plug 221 in the region through which the first etch stop layer 51 passes may be less than the lateral width of the first dummy contact plug 221 in the region through which the second etch stop layer 52 passes.

Figure 11:
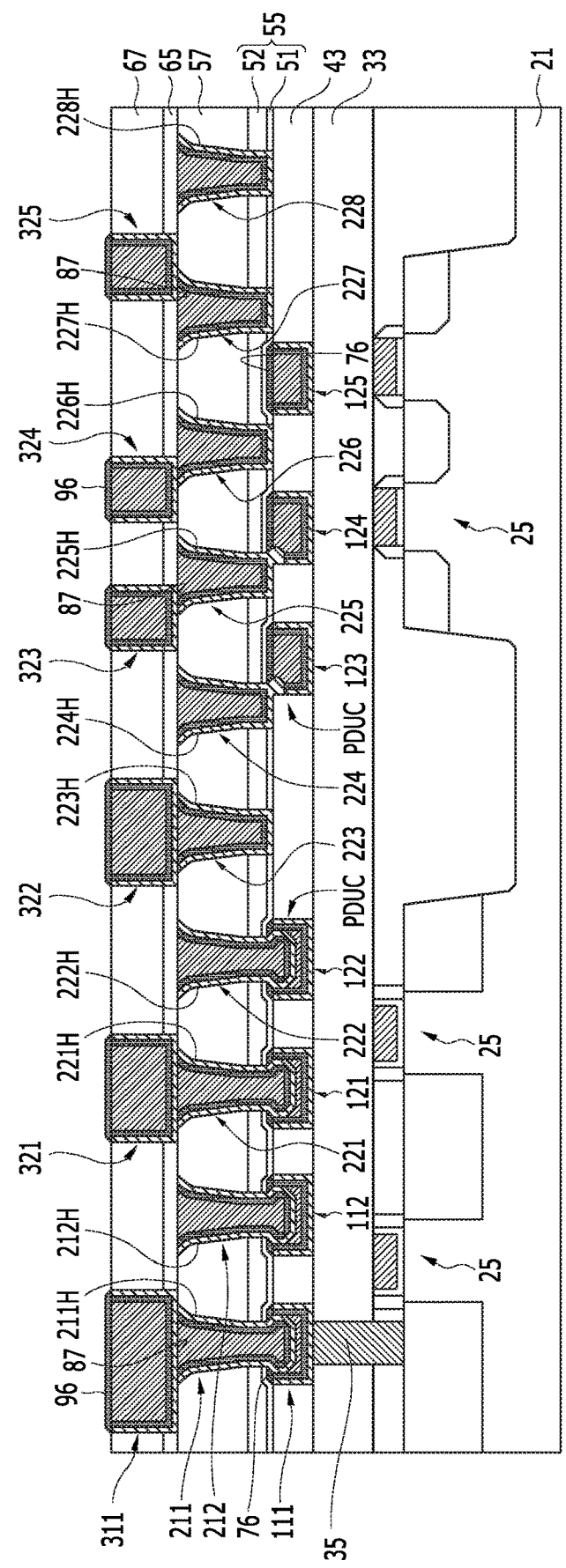
FIG. 11 is a cross-sectional view for describing a semiconductor device including dummy contact plugs according to example embodiments of inventive concepts.

FIG. 11 is a cross-sectional view for describing a semiconductor device including dummy contact plugs according to example embodiments of inventive concepts, and FIGS. 12 and 13 are partially enlarged views illustrating a part of FIG. 11;

Referring to FIG. 11, a semiconductor device according to embodiments of inventive concepts may include a substrate 21, a lower insulating layer 24, a plurality of active/passive devices 25, a first insulating interlayer 33, a lower plug 35, a second insulating interlayer 43, a lower etch stop layer 55, a third insulating interlayer 57, an upper etch stop layer 65, a fourth insulating interlayer 67, lower capping patterns 76, upper capping patterns 96, lower interconnections 111, 112, 121, 122, 123, 124, and 125, contact holes 211H, 212H, 221H, 222H, 223H, 224H, 225H, 226H, 227H, and 228H, contact plugs 211, 212, 221, 222, 223, 224, 225, 226, 227, and 228, and upper interconnections 311, 321, 322, 323, 324, and 325. The lower etch stop layer 55 may include a first etch stop layer 51 and a second etch stop layer 52.

Referring to FIG. 12, a first lower dummy interconnection 121 may include a first lower barrier layer 71, a second lower barrier layer 72, a lower seed layer 73, and a lower conductive layer 74. The lower capping pattern 76 may be formed on the first lower dummy interconnection 121. The first dummy contact plug 221 may include a first contact barrier layer 81, a second contact barrier layer 82, a contact seed layer 83, and a contact conductive layer 84. The first dummy contact plug 221 may pass through the lower capping pattern 76 and fill a recessed region PDUC formed inside the first lower dummy interconnection 121. A lower end of the first dummy contact plug 221 may be formed at a lower level than an upper end of the first lower dummy interconnection 121. The first contact barrier layer 81 may be in contact with, e.g. in direct contact with, the lower conductive layer 74. The first upper dummy interconnection 321 may include a first upper barrier layer 91, a second upper barrier layer 92, an upper seed layer 93, and an upper conductive layer 94. The first upper barrier layer 91 may be in contact with, e.g. in direct contact with, an upper surface of the first dummy contact plug 221. An upper capping pattern 96 may be formed on the first upper dummy interconnection 321.

Referring to FIG. 13, in one example embodiment, the first dummy contact plug 221 may be formed on the lower capping pattern 76. The lower capping pattern 76 may be between a first lower dummy interconnection 121 and the first dummy contact plug 221.

Figure 14:
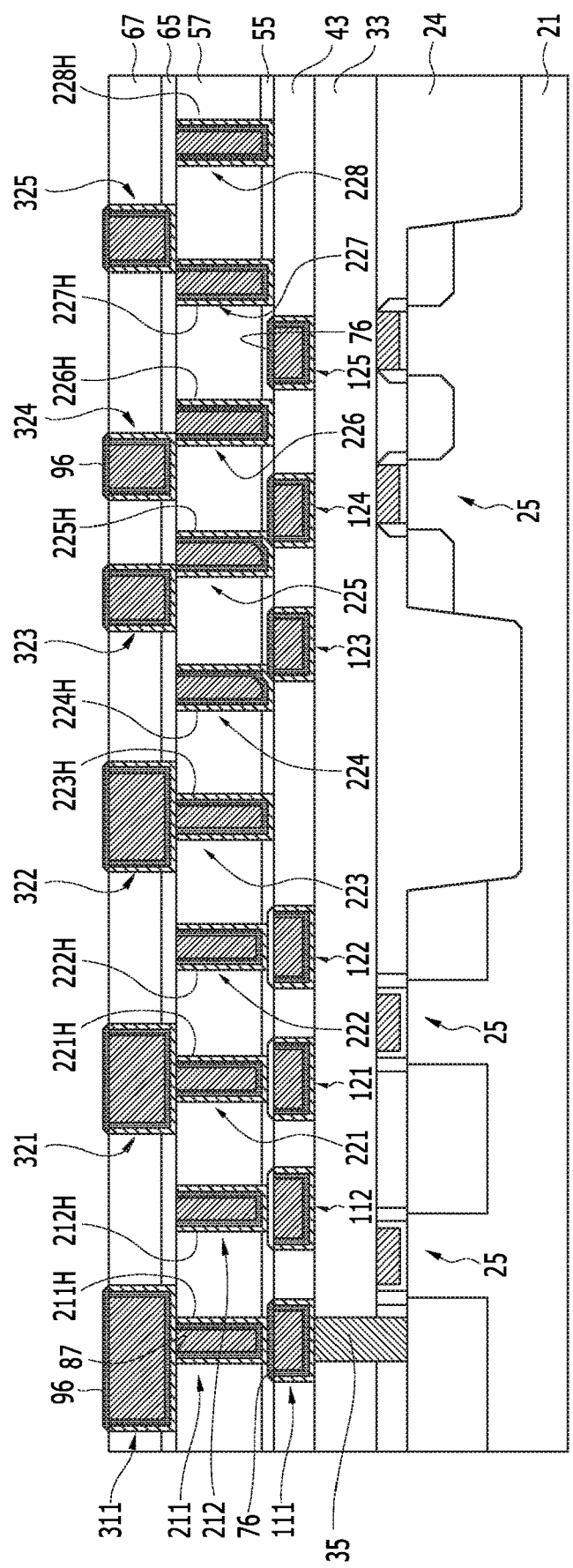
FIG. 14 is a cross-sectional view for describing a semiconductor device including dummy contact plugs according to example embodiments of inventive concepts.

FIG. 14 is a cross-sectional view for describing a semiconductor device including dummy contact plugs according to example embodiments of inventive concepts.

Referring to FIG. 14, a semiconductor device according to embodiments of inventive concepts may include a substrate 21, a lower insulating layer 24, a plurality of active/passive devices 25, a first insulating interlayer 33, a lower plug 35, a second insulating interlayer 43, a lower etch stop layer 55, a third insulating interlayer 57, an upper etch stop layer 65, a fourth insulating interlayer 67, lower capping patterns 76, upper capping patterns 96, lower interconnections 111, 112, 121, 122, 123, 124, and 125, contact holes 211H, 212H, 221H, 222H, 223H, 224H, 225H, 226H, 227H, and 228H, contact plugs 211, 212, 221, 222, 223, 224, 225, 226, 227, and 228, and upper interconnections 311, 321, 322, 323, 324, and 325. The lower etch stop layer 55 may include a material having etch selectivity with respect to the third insulating interlayer 57.

Figure 15:
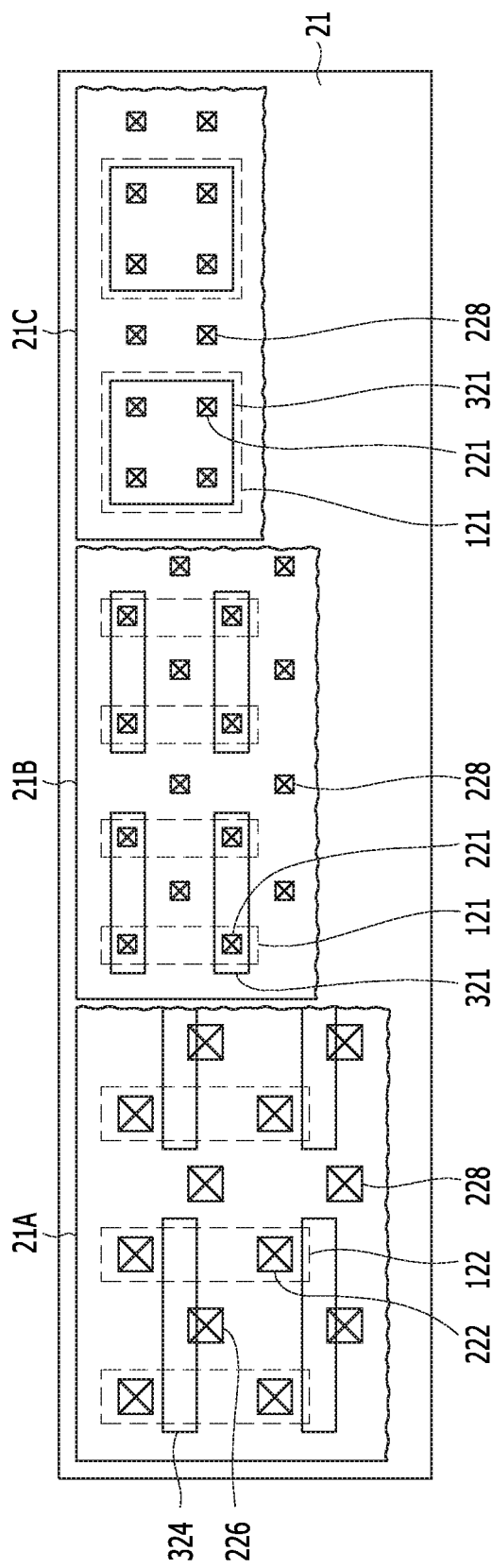
FIG. 15 is a layout for describing a semiconductor device including dummy contact plugs according to example embodiments of inventive concepts.

FIG. 15 is a layout for describing a semiconductor device including dummy contact plugs according to example embodiments of inventive concepts.

Referring to FIG. 15, a second lower dummy interconnection 122, a second dummy contact plug 222, a sixth dummy contact plug 226, an eighth dummy contact plug 228, and a fourth upper dummy interconnection 324 may be in a first dummy region 21A on a substrate 21. The second dummy contact plug 222 may overlap the second lower dummy interconnection 122. The sixth dummy contact plug 226 may partially underlap the fourth upper dummy interconnection 324. An underlapping area of the sixth dummy contact plug 226 and the fourth upper dummy interconnection 324 may be less than 0.5 times an area of the sixth dummy contact plug 226. The eighth dummy contact plug 228 may be interpreted as not overlapping with the second lower dummy interconnection 122 and the fourth upper dummy interconnection 324. The sixth dummy contact plug 226 and the eighth dummy contact plug 228 may be interpreted as off-axis dummy contact plugs. In one example embodiment, the second lower dummy interconnection 122 may correspond to a lower main interconnection. The fourth upper dummy interconnection 324 may correspond to an upper main interconnection.

A first lower dummy interconnection 121, a first dummy contact plug 221, an eighth dummy contact plug 228, and a first upper dummy interconnection 321 may be formed inside a second dummy region 21B of the substrate 21. The first dummy contact plug 221 may overlap the first lower dummy interconnection 121 and the first upper dummy interconnection 321. The eighth dummy contact plug 228 may be interpreted as not overlapping with the first lower dummy interconnection 121 and the first upper dummy interconnection 321.

The first lower dummy interconnection 121, the first dummy contact plug 221, the eighth dummy contact plug 228, and the first upper dummy interconnection 321 may be formed inside a third dummy region 21C of the substrate 21. The first dummy contact plug 221 may overlap the first lower dummy interconnection 121 and the first upper dummy interconnection 321.

FIGS. 16 to 20 and 27 to 30 are cross-sectional views for describing a method of forming a semiconductor device according to example embodiments of inventive concepts, and FIGS. 21 to 26 are partially enlarged views illustrating a part of FIG. 20. A method of forming a semiconductor device according to one example embodiment may include performing a single damascene process.

Figure 16:
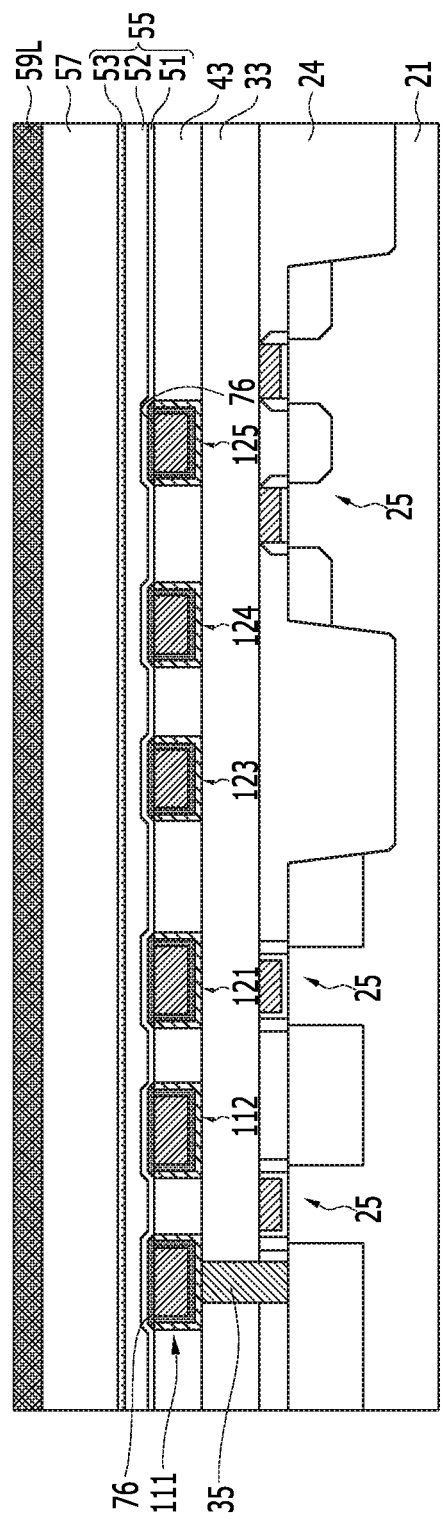

Referring to FIG. 16, a lower insulating layer 24 and a plurality of active/passive devices 25 may be formed on a substrate 21.

The substrate 21 may include a semiconductor substrate such as a silicon wafer or silicon on insulator (SOI) wafer. The lower insulating layer 24 may include silicon oxide, silicon nitride, silicon oxynitride, or a combination thereof. The plurality of active/passive devices 25 may include various types of devices such as a fin field effect transistor (finFET), a planar transistor, and interconnections.

A first insulating interlayer 33 may be formed to cover, e.g. entirely cover the substrate 21. A lower plug 35, which passes through the first insulating interlayer 33 and is connected to one selected from the active/passive devices 25, may be formed. The first insulating interlayer 33 may include silicon oxide, silicon nitride, silicon oxynitride, low-K dielectrics, or a combination thereof. The lower plug 35 may include a metal, a metal nitride, a metal silicide, polysilicon, conductive carbon, or a combination thereof.

A second insulating interlayer 43 may be formed on the first insulating interlayer 33. The second insulating interlayer 43 may include silicon oxide, silicon nitride, silicon oxynitride, low-K dielectrics, or a combination thereof. Lower interconnections 111, 112, 121, 123, 124, and 125 may be formed inside the first insulating interlayer 33. Upper surfaces of the second insulating interlayer 43 and the lower interconnections 111, 112, 121, 123, 124, and 125 may be coplanar, or substantially coplanar. Each of the lower interconnections 111, 112, 121, 123, 124, and 125 may include a first lower barrier layer 71, a second lower barrier layer 72, a lower seed layer 73, and a lower conductive layer 74, as shown in FIG. 2. Lower capping patterns 76 may be formed on the lower interconnections 111, 112, 121, 123, 124, and 125.

A process of forming the lower interconnections 111, 112, 121, 123, 124, and 125 may include performing a thin film forming process and a planarization process. The planarization process may include performing a CMP process and/or etch-back process. The first lower barrier layer 71 and the second lower barrier layer 72 may be formed to surround side surfaces and bottoms of the lower seed layer 73 and the lower conductive layer 74. The first lower barrier layer 71 may include Ti, TiN, Ta, TaN, or a combination thereof. The second lower barrier layer 72 may be formed between the first lower barrier layer 71 and the lower seed layer 73. The second lower barrier layer 72 may include Co, Ru, Ni, Mn, or a combination thereof. In one example embodiment, the second lower barrier layer 72 may include a cobalt (Co) layer. The lowered layer 73 and the lower conductive layer 74 may include a metal, a metal nitride, a metal silicide, conductive carbon, or a combination thereof.

For example, the lower seed layer 73 may be formed on the second lower barrier layer 72 using a chemical vapor deposition (CVD) method, a physical vapor deposition (PVD) method, or a combination thereof. The lower conductive layer 74 may be formed using an electroplating method. However, inventive concepts are not limited thereto. In one example embodiment, the lower seed layer 73 and the lower conductive layer 74 may include copper (Cu). The lower seed layer 73 may be omitted.

The lower interconnections 111, 112, 121, 123, 124, and 125 may include a first lower main interconnection 111, a second lower main interconnection 112, a first lower dummy interconnection 121, a third lower dummy interconnection 123, a fourth lower dummy interconnection 124, and a fifth lower dummy interconnection 125. The first lower main interconnection 111 may be connected to the lower plug 35. The lower capping patterns 76 may be formed using a selective deposition technique. For example, the lower capping patterns 76 may include a cobalt (Co) layer formed by a CVD method using a selectivity of 100:1 or more. The second lower barrier layer 72 and the lower capping patterns 76 may serve to improve an electromigration (EM) characteristic of the lower conductive layer 74.

A lower etch stop layer 55 may be formed on the second insulating interlayer 43 and the lower capping patterns 76. A third insulating interlayer 57 may be formed on the lower etch stop layer 55. A mask layer 59L may be formed on the third insulating interlayer 57. The lower etch stop layer 55 may include a first etch stop layer 51, a second etch stop layer 52 on the first etch stop layer 51, and a third etch stop layer 53 on the second etch stop layer 52. The second etch stop layer 52 may be thicker than the first etch stop layer 51 or the third etch stop layer 53.

The third insulating interlayer 57 may include silicon oxide, silicon nitride, silicon oxynitride, low-K dielectrics, or a combination thereof. The mask layer 59L may include a material having etch selectivity with respect to the third insulating interlayer 57. In one example embodiment, the mask layer 59L may include TiN. The third insulating interlayer 57 may include low-K dielectrics.

The third etch stop layer 53 may be thinner than the mask layer 59L. The third etch stop layer 53 may include a material having etch selectivity with respect to the third insulating interlayer 57. The third etch stop layer 53 may include a material that is easily removed simultaneously with the mask layer 59L while a process of removing the mask layer 59L is performed. In one example embodiment, the third etch stop layer 53 may include AlOC, AlO, AlON, or a combination thereof.

The second etch stop layer 52 may include a material having etch selectivity with respect to the third etch stop layer 53. In one example embodiment, the second etch stop layer 52 may include oxygen-doped SiC (ODC). The first etch stop layer 51 may include a material having etch selectivity with respect to the third insulating interlayer 57, the second etch stop layer 52, the lower capping patterns 76, and the lower interconnections 111, 112, 121, 123, 124, and 125. In one example embodiment, the first etch stop layer 51 may include AlN.

Referring to FIG. 17, a hard mask pattern 59 may be formed by patterning the mask layer 59L. Contact holes 211H, 212H, 221H, 224H, 225H, 226H, 227H, and 228H passing through the third insulating interlayer 57 may be formed. An anisotropic etch process using the hard mask pattern 59 as an etching mask may be applied to the formation of the contact holes 211H, 212H, 221H, 224H, 225H, 226H, 227H, and 228H. For example, an all-in-one (AIO) etch process may be used for the formation of the contact holes 211H, 212H, 221H, 224H, 225H, 226H, 227H, and 228H. The third etch stop layer 53 may be exposed at bottoms of the contact holes 211H, 212H, 221H, 224H, 225H, 226H, 227H, and 228H.

In adjacent regions on the substrate 21, density and opening ratios of the contact holes 211H, 212H, 221H, 224H, 225H, 226H, 227H and 228H may be the same, or substantially the same. In the adjacent regions on the substrate 21, gaps between the contact holes 211H, 212H, 221H, 224H, 225H, 226H, 227H, and 228H may be the same, or substantially the same, and shapes of the contact holes 211H, 212H, 221H, 224H, 225H, 226H, 227H, and 228H may be the same, or substantially the same. The contact holes 211H, 212H, 221H, 224H, 225H, 226H, 227H, and 228H may include a first main contact hole 211H, a second main contact hole 212H, a first dummy contact hole 221H, a fourth dummy contact hole 224H, a fifth dummy contact hole 225H, a sixth dummy contact hole 226H, a seventh dummy contact hole 227H, and an eighth dummy contact hole 228H.

Referring to FIG. 18, an upper surface of the third insulating interlayer 57 may be exposed by removing the hard mask pattern 59. The third etch stop layer 53 may include a material that is easily removed simultaneously with the hard mask pattern 59 while a process of removing the hard mask pattern 59 is performed. In one example embodiment, the hard mask pattern 59 may include TiN, and the third etch stop layer 53 may include AlOC, AlO, AlON, or a combination thereof. While the hard mask pattern 59 is removed, the third etch stop layer 53 exposed at the bottoms of the contact holes 211H, 212H, 221H, 224H, 225H, 226H, 227H, and 228H may also be removed. The second etch stop layer 52 may be exposed at the bottoms of the contact holes 211H, 212H, 221H, 224H, 225H, 226H, 227H, and 228H.

Referring to FIG. 19, edges of the third insulating interlayer 57 adjacent to upper ends of the contact holes 211H, 212H, 221H, 224H, 225H, 226H, 227H, and 228H may be formed to be round by performing a top corner rounding (TCR) etch process. Upper regions of the contact holes 211H, 212H, 221H, 224H, 225H, 226H, 227H, and 228H may expand. The TCR etch process may include performing an etch process using plasma.

While the TCR etch process is performed, the second etch stop layer 52 and the first etch stop layer 51 may serve to prevent or reduce the likelihood of plasma damage occurring on the lower capping patterns 76 and the lower interconnections 111, 112, 121, 123, 124, and 125. While the TCR etch process is performed, the second etch stop layer 52 may serve to reduce etching damage on the first etch stop layer 51. While the TCR etch process is performed, the second etch stop layer 52 may be removed, and the first etch stop layer 51 may be exposed at the bottoms of the contact holes 211H, 212H, 221H, 224H, 225H, 226H, 227H, and 228H.

Figure 21:
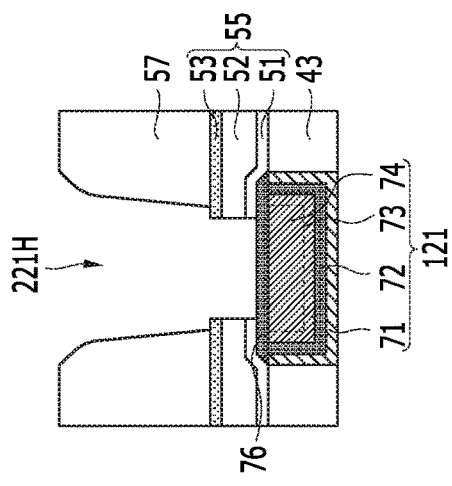
FIGS. 21 to 26 are partially enlarged views illustrating a part of FIG. 20.

Referring to FIGS. 20 and 21, the lower capping patterns 76 may be exposed at the bottoms of the contact holes 211H, 212H, 221H, 224H, 225H, 226H, 227H, and 228H by removing the first etch stop layer 51. The second insulating interlayer 43 may be exposed at the bottoms of the fourth dummy contact hole 224H, the fifth dummy contact hole 225H, the sixth dummy contact hole 226H, the seventh dummy contact hole 227H, and the eighth dummy contact hole 228H.

Figure 22:
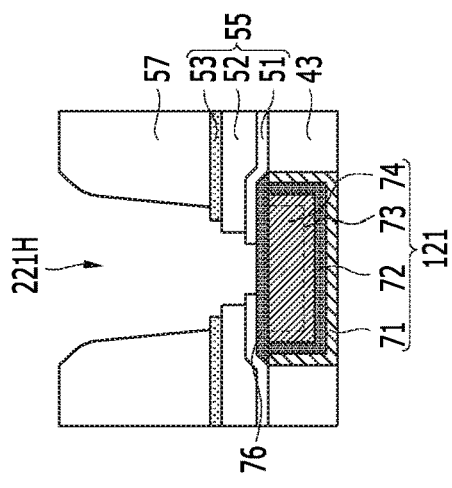

Referring to FIG. 22, in one example embodiment, the lower etch stop layer 55 may protrude in a lateral direction and have a stepped shape in a lower region of the first dummy contact hole 221H. For example, a lateral width of the first dummy contact hole 221H in a region through which the third etch stop layer 53 passes may be less than a lateral width of the first dummy contact hole 221H in a region through which the third insulating interlayer 57 passes. A lateral width of the first dummy contact hole 221H in a region through which the second etch stop layer 52 passes may be less than the lateral width of the first dummy contact hole 221H in the region through which the third etch stop layer 53 passes. A lateral width of the first dummy contact hole 221H in a region through which the first etch stop layer 51 passes may be less than the lateral width of the first dummy contact hole 221H in the region through which the second etch stop layer 52 passes. An upper surface of the third etch stop layer 53 may laterally protrude toward inside of the first dummy contact hole 221H rather than toward a side surface of the third insulating interlayer 57. The first etch stop layer 51, the second etch stop layer 52, and the third etch stop layer 53 may have a stepped shape in the first dummy contact hole 221H.

Figure 23:
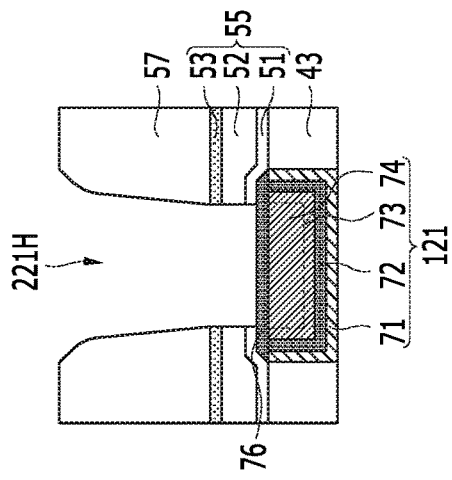

Referring to FIG. 23, in a lower region of the first dummy contact hole 221H, the lower etch stop layer 55 may protrude in the lateral direction. A lateral width of the first dummy contact hole 221H in a region through which the lower etch stop layer 55 passes may be less than the lateral width of the first dummy contact hole 221H in the region through which the third insulating interlayer 57 passes. The upper surface of the third etch stop layer 53 may laterally protrude toward the inside of the first dummy contact hole 221H rather than toward the side surface of the third insulating interlayer 57.

Figure 24:
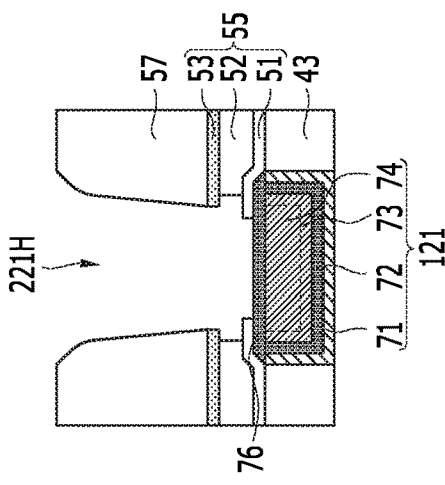

Referring to FIG. 24, the upper surface of the third etch stop layer 53 may laterally protrude toward the inside of the first dummy contact hole 221H rather than the side surface of the third insulating interlayer 57. An upper surface of the second etch stop layer 52 may laterally protrude toward the inside of the first dummy contact hole 221H rather than the side surface of the third etch stop layer 53.

Figure 25:
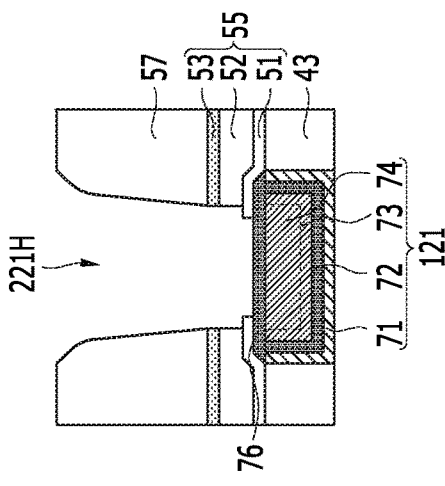

Referring to FIG. 25, an upper surface of the first etch stop layer 51 may laterally protrude toward the inside of the first dummy contact hole 221H rather than the side surface of the second etch stop layer 52.

Figure 26:
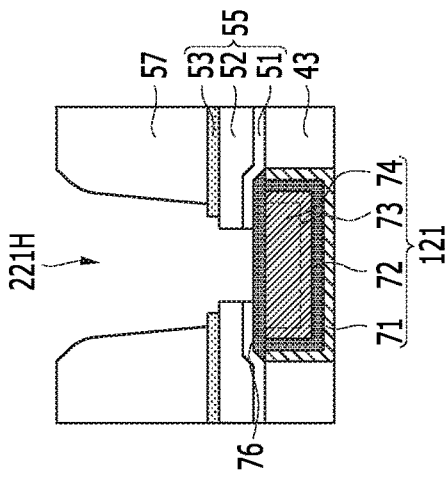

Referring to FIG. 26, the lateral width of the first dummy contact hole 221H in the region through which the second etch stop layer 52 passes may be greater than the lateral width of the first dummy contact hole 221H in the region through which the third etch stop layer 53 passes. An under-cut region may be formed under the third etch stop layer 53. The lateral width of the first dummy contact hole 221H in the region through which the first etch stop layer 51 passes may be less than the lateral width of the first dummy contact hole 221H in the region through which the second etch stop layer 52 passes.

Figure 27:
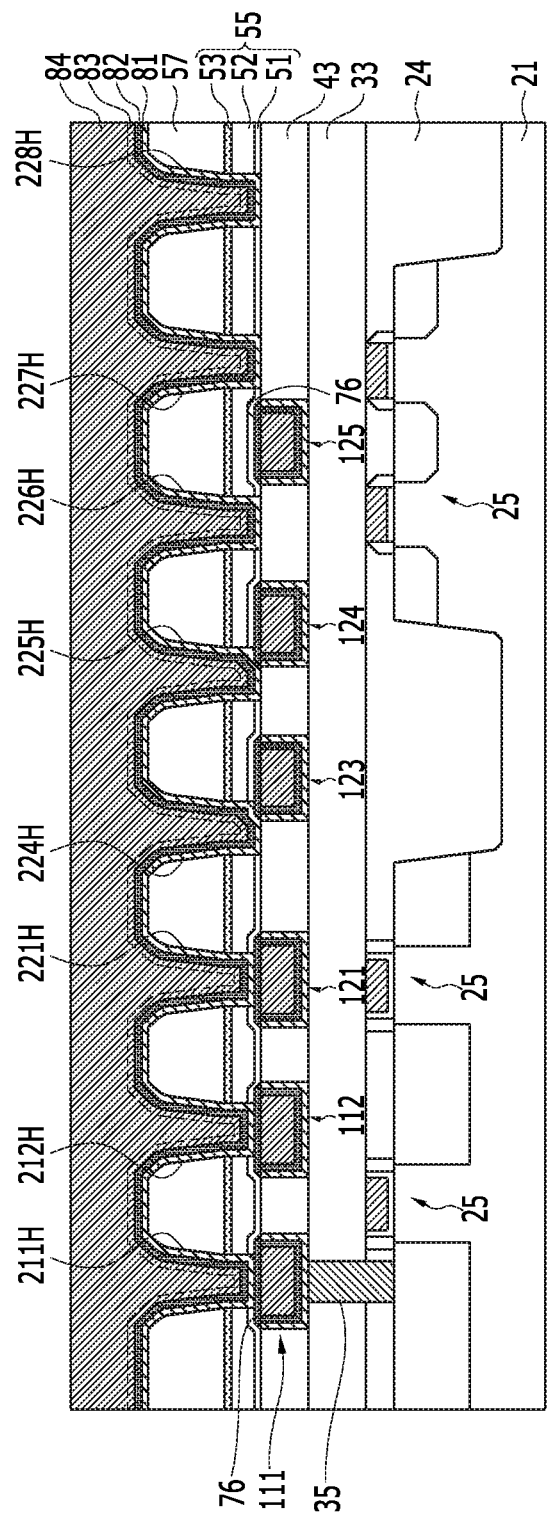

Referring to FIG. 27, a first contact barrier layer 81, a second contact barrier layer 82, a contact seed layer 83, and a contact conductive layer 84, which are sequentially stacked and fill the insides of the contact holes 211H, 212H, 221H, 224H, 225H, 226H, 227H, and 228H may be formed. The first contact barrier layer 81 may be in contact with, e.g. in direct contact with, the lower capping patterns 76.

The first contact barrier layer 81 may include Ti, TiN, Ta, TaN, or a combination thereof. The second contact barrier layer 82 may include Co, Ru, Ni, Mn, or a combination thereof. In one example embodiment, the second contact barrier layer 82 may include a cobalt (Co) layer. The contact seed layer 83 and the contact conductive layer 84 may include a metal, a metal nitride, a metal silicide, conductive carbon, or a combination thereof. For example, the contact seed layer 83 may be formed on the second contact barrier layer 82 using a CVD method, a PVD method, or a combination thereof. The contact conductive layer 84 may be formed using an electroplating method. In one example embodiment, the contact seed layer 83 and the contact conductive layer 84 may include copper (Cu). The contact seed layer 83 may be omitted. The second contact barrier layer 82 may serve to improve an EM characteristic of the contact conductive layer 84.

Figure 28:
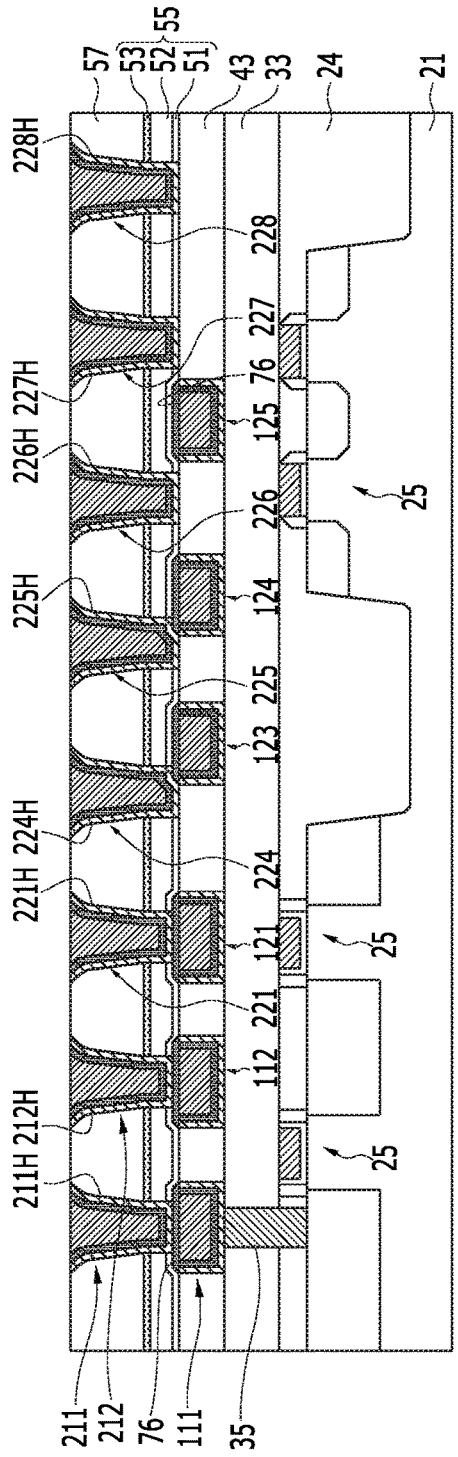

Referring to FIG. 28, the contact plugs 211, 212, 221, 224, 225, 226, 227, and 228 may be formed by partially removing the contact conductive layer 84, the contact seed layer 83, the second contact barrier layer 82, and the first contact barrier layer 81 by performing a planarization process such as a CMP process until the third insulating interlayer 57 is exposed. Upper surfaces of the contact plugs 211, 212, 221, 224, 225, 226, 227, and 228 and the third insulating interlayer 57 may be exposed at the same, or substantially the same plane. In one example embodiment, the upper surfaces of the contact plugs 211, 212, 221, 224, 225, 226, 227 and 228 may be recessed downward, as shown in FIG. 3 or 4.

The contact plugs 211, 212, 221, 224, 225, 226, 227, and 228 may include a first main contact plug 211, a second main contact plug 212, a first dummy contact plug 221, a fourth dummy contact plug 224, a fifth dummy contact plug 225, a sixth dummy contact plug 226, a seventh dummy contact plug 227, and an eighth dummy contact plug 228. The first main contact plug 211 and the second main contact plug 212 may overlap the first lower main interconnection 111 and the second lower main interconnection 112. The first dummy contact plug 221 may overlap the first lower dummy interconnection 121.

The fourth dummy contact plug 224 and the fifth dummy contact plug 225 may partially overlap the third lower dummy interconnection 123 and the fourth lower dummy interconnection 124. A vertical central axis of the fourth dummy contact plug 224 may be located outside the third lower dummy interconnection 123. A vertical central axis of the fifth dummy contact plug 225 may be located outside the fourth lower dummy interconnection 124. The sixth dummy contact plug 226, the seventh dummy contact plug 227, and the eighth dummy contact plug 228 may be formed on the second insulating interlayer 43. The sixth dummy contact plug 226, the seventh dummy contact plug 227, and the eighth dummy contact plug 228 may be interpreted as not overlapping with the lower interconnections 111, 112, 121, 123, 124, and 125. The fourth dummy contact plug 224, the fifth dummy contact plug 225, the sixth dummy contact plug 226, the seventh dummy contact plug 227, and the eighth dummy contact plug 228 may be interpreted as off-axis dummy contact plugs.

In adjacent regions on the substrate 21, density, gaps, and shapes of the contact plugs 211, 212, 221, 224, 225, 226, 227, and 228 may be the same, or substantially the same. Defects, such as dishing, caused by a planarization process of forming the contact plugs 211, 212, 221, 224, 225, 226, 227, and 228 may be reduced, or significantly reduced, in comparison to conventional devices. The contact plugs 211, 212, 221, 224, 225, 226, 227, and 228 may be formed by performing a single damascene process.

In one example embodiment, via capping patterns 86 similar to those described with reference to FIG. 5 may be formed on the contact plugs 211, 212, 221, 224, 225, 226, 227, and 228. The via capping patterns 86 may be formed using a selective deposition technique. For example, the via capping patterns 86 may include a cobalt (Co) layer formed by a CVD method using a selectivity of 100:1 or more. The via capping patterns 86 may protrude at a higher level than the upper surface of the third insulating interlayer 57.

In one example embodiment, the via capping patterns 86 may be formed using a thin film forming process and a patterning process. The via capping patterns 86 may be omitted.

Figure 29:
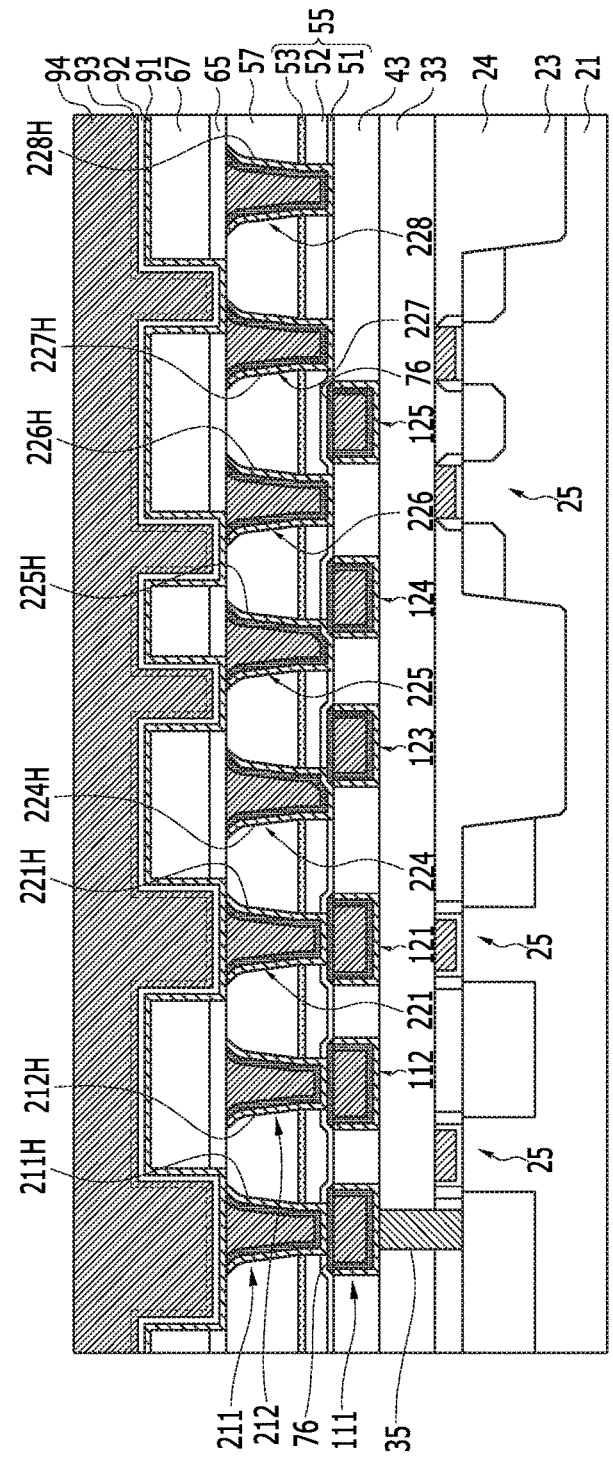

Referring to FIG. 29, an upper etch stop layer 65 and a fourth insulating interlayer 67 may be sequentially formed on the contact plugs 211, 212, 221, 224, 225, 226, 227, and 228 and the third insulating interlayer 57. The fourth insulating interlayer 67 may include silicon oxide, silicon nitride, silicon oxynitride, low-K dielectrics, or a combination thereof. The upper etch stop layer 65 may include a material having etch selectivity with respect to the fourth insulating interlayer 67. For example, the upper etch stop layer 65 may include nitride.

Trenches passing through the fourth insulating interlayer 67 and the upper etch stop layer 65 may be formed. A first upper barrier layer 91, a second upper barrier layer 92, an upper seed layer 93, and an upper conductive layer 94, which are stacked, e.g. sequentially stacked and cover the trenches and the fourth insulating interlayer 67, may be formed. The first upper barrier layer 91 may be in contact with, e.g. in direct contact with, the upper surface of the contact plugs 211, 212, 221, 224, 225, 226, 227, and 228.

The first upper barrier layer 91 may include Ti, TiN, Ta, TaN, or a combination thereof. The second upper barrier layer 92 may include Co, Ru, Ni, Mn, or a combination thereof. In one example embodiment, the second upper barrier layer 92 may include a cobalt (Co) layer. The upper seed layer 93 and the upper conductive layer 94 may include a metal, a metal nitride, a metal silicide, conductive carbon, or a combination thereof. For example, the upper seed layer 93 may be formed on the second upper barrier layer 92 using a CVD method, a PVD method, or a combination thereof. The upper conductive layer 94 may be formed using an electroplating method. In one example embodiment, the upper seed layer 93 and the upper conductive layer 94 may include copper (Cu). The upper seed layer 93 may be omitted.

Figure 30:
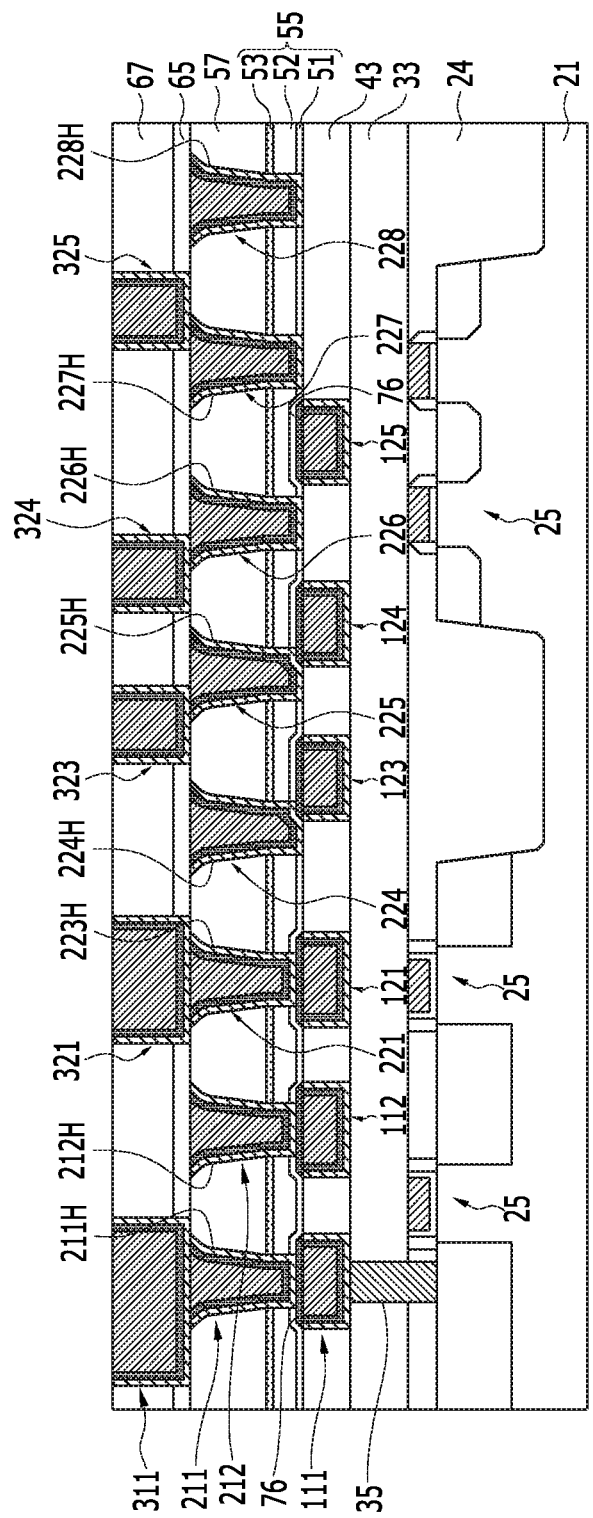

Referring to FIG. 30, upper interconnections 311, 321, 323, 324, and 325 may be formed by partially removing the upper conductive layer 94, the upper seed layer 93, the second upper barrier layer 92, and the first upper barrier layer 91 by performing a planarization process such as a CMP process until the fourth insulating interlayer 67 is exposed. Upper surfaces of the upper interconnections 311, 321, 323, 324, and 325 and the fourth insulating interlayer 67 may be exposed at the same, or substantially the same plane.

The upper interconnections 311, 321, 323, 324, and 325 may include an upper main interconnection 311, a first upper dummy interconnection 321, a third upper dummy interconnection 323, a fourth upper dummy interconnection 324, and a fifth upper dummy interconnection 325. The first main contact plug 211 may overlap the upper main interconnection 311. The first dummy contact plug 221 may overlap the first upper dummy interconnection 321. The fifth dummy contact plug 225, the sixth dummy contact plug 226, and the seventh dummy contact plug 227 may partially overlap the third upper dummy interconnection 323, the fourth upper dummy interconnection 324, and the fifth upper dummy interconnection 325. A vertical central axis of the fifth dummy contact plug 225 may be located outside the third upper dummy interconnection 323. A vertical central axis of the sixth dummy contact plug 226 may be located outside the fourth upper dummy interconnection 324.

Referring again to FIG. 1, the upper capping patterns 96 may be formed on the upper interconnections 311, 321, 323, 324, and 325. The upper capping patterns 96 may be formed using a selective deposition technique. For example, the upper capping patterns 96 may include a cobalt (Co) layer formed by a CVD method using a selectivity of 100:1 or more. The upper capping patterns 96 may protrude at a higher level than the upper surface of the fourth insulating interlayer 67. The second upper barrier layer 92 and the upper capping patterns 96 may serve to improve an EM characteristic of the upper conductive layer 94.

In one example embodiment, the upper capping patterns 96 may be formed using a thin film forming process and a patterning process. The upper capping patterns 96 may be omitted.

FIGS. 31 to 36, 39, and 40 are cross-sectional views for describing a method of forming a semiconductor device according to example embodiments of inventive concepts, and FIGS. 37 and 38 are partially enlarged views illustrating a part of FIG. 36.

Figure 31:
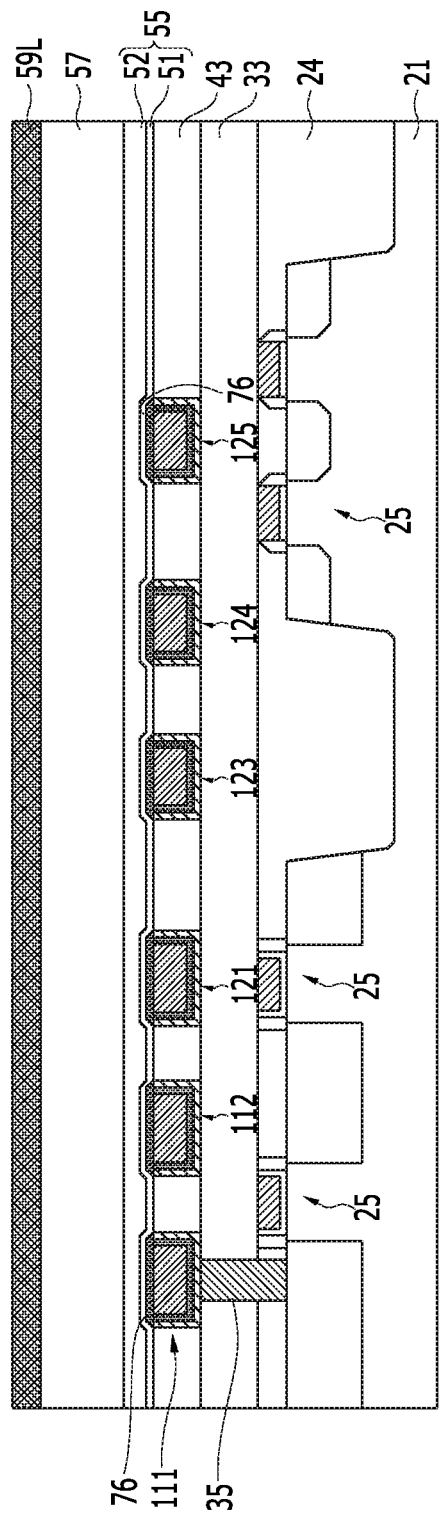

Referring to FIG. 31, a lower insulating layer 24, and a plurality of active/passive devices 25, a first insulating interlayer 33, a lower plug 35, a second insulating interlayer 43, lower interconnections 111, 112, 121, 123, 124, and 125, and lower capping patterns 76 may be formed on a substrate 21. A lower etch stop layer 55 may be formed on the second insulating interlayer 43 and the lower capping patterns 76. A third insulating interlayer 57 may be formed on the lower etch stop layer 55. A mask layer 59L may be formed on the third insulating interlayer 57.

The lower etch stop layer 55 may include a first etch stop layer 51 and a second etch stop layer 52 on the first etch stop layer 51. The second etch stop layer 52 may be thicker than the first etch stop layer 51. The second etch stop layer 52 may include ODC. The first etch stop layer 51 may include a material having etch selectivity with respect to the third insulating interlayer 57, the second etch stop layer 52, the lower capping patterns 76, and the lower interconnections 111, 112, 121, 123, 124, and 125. In one example embodiment, the first etch stop layer 51 may include AlN.

Figure 32:
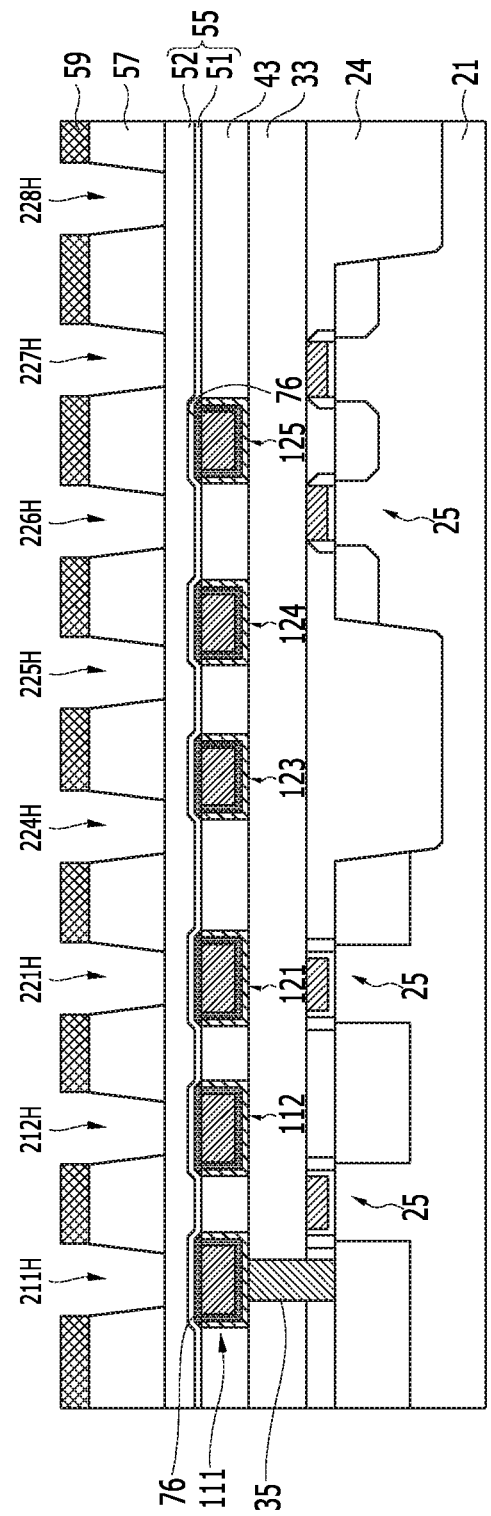

Referring to FIG. 32, a hard mask pattern 59 may be formed by patterning the mask layer 59L. Contact holes 211H, 212H, 221H, 224H, 225H, 226H, 227H, and 228H passing through the third insulating interlayer 57 may be formed. The second etch stop layer 52 may be exposed at bottoms of the contact holes 211H, 212H, 221H, 224H, 225H, 226H, 227H, and 228H.

Figure 33:
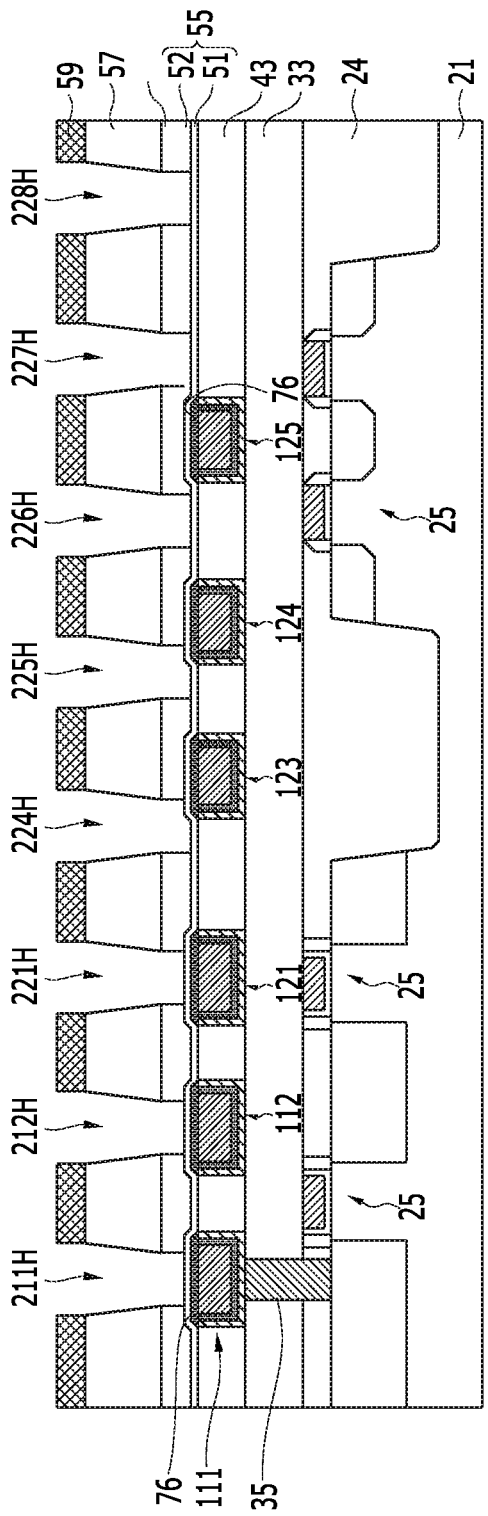

Referring to FIG. 33, the first etch stop layer 51 may be exposed at the bottoms of the contact holes 211H, 212H, 221H, 224H, 225H, 226H, 227H, and 228H by removing the second etch stop layer 52.

Figure 34:
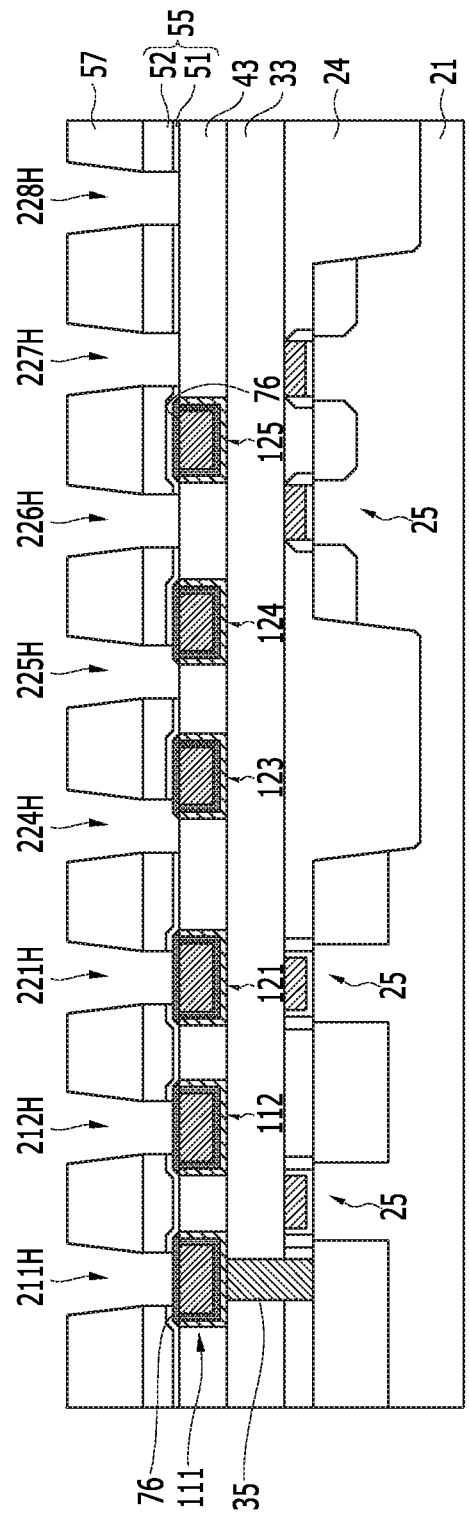

Referring to FIG. 34, an upper surface of the third insulating interlayer 57 may be exposed by removing the hard mask pattern 59. While a process of removing the hard mask pattern 59 is performed, the first etch stop layer 51 exposed at the bottoms of the contact holes 211H, 212H, 221H, 224H, 225H, 226H, 227H, and 228H may also be removed. The lower capping patterns 76 may be exposed at the bottoms of the contact holes 211H, 212H, 221H, 224H, 225H, 226H, 227H, and 228H.

Referring to FIG. 35, edges of the third insulating interlayer 57 adjacent to upper ends of the contact holes 211H, 212H, 221H, 224H, 225H, 226H, 227H, and 228H may be formed to be round by performing a TCR etch process. Upper regions of the contact holes 211H, 212H, 221H, 224H, 225H, 226H, 227H, and 228H may expand. The TCR etch process may include performing an etch process using plasma. While the TCR etch process is performed, a plasma damage region PD may occur in the lower capping patterns 76 and the lower interconnections 111, 112, 121, 123, 124, and 125.

Referring to FIGS. 36 and 37, while a cleaning process is performed, the plasma damage region PD may be removed and recessed regions PDUC may be inside, e.g. formed inside the lower capping patterns 76 and the lower interconnections 111, 112, 121, 123, 124, and 125. The recessed regions PDUC may communicate with lower portions of the contact holes 211H, 212H, 221H, 224H, 225H, 226H, 227H, and 228H.

Referring to FIG. 38, in one example embodiment, the lower capping patterns 76 may remain in a lower portion of the first dummy contact hole 221H.

Referring to FIG. 39, contact plugs 211, 212, 224, 225, 226, 227, and 228 may be formed. The contact plugs 211, 212, 221, 224, 225, 226, 227, and 228 may fill inside of the recessed regions PDUC.

Figure 40:
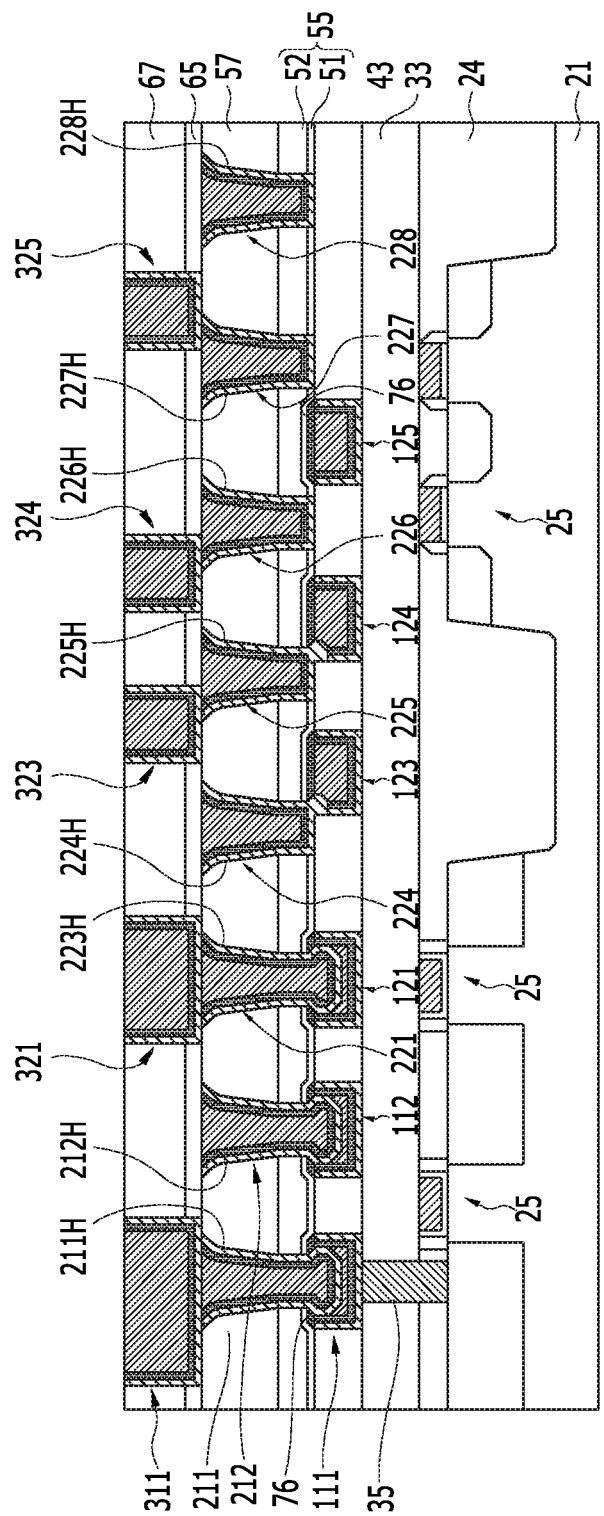

Referring to FIG. 40, an upper etch stop layer 65 and a fourth insulating interlayer 67 may be sequentially formed on the contact plugs 211, 212, 221, 224, 225, 226, 227, and 228 and the third insulating interlayer 57. Upper interconnections 311, 321, 323, 324, and 325 passing through the fourth insulating interlayer 67 and the upper etch stop layer 65 may be formed.

Referring again to FIG. 11, the upper capping patterns 96 may be formed on the upper interconnections 311, 321, 323, 324, and 325.

According to the example embodiments of inventive concepts, an off-axis dummy contact plug can be provided. In adjacent regions on a substrate, density, gaps, and shapes of contact plugs can be formed to be the same, or substantially the same. Defects caused by a planarization process of forming the contact plugs may be reduced, or significantly reduced in comparison to conventional devices. A semiconductor device advantageous for reducing defects in an interconnection process and achieving high integration may be embodied.

While the embodiments of inventive concepts have been described with reference to the accompanying drawings, it should be understood by those skilled in the art that various modifications may be made without departing from the scope of inventive concepts and without changing essential features. Therefore, the above-described embodiments should be considered in a descriptive sense only and not for purposes of limitation.

What is claimed is:

1. A semiconductor device comprising:
    an insulating layer on a substrate;
    a plurality of main contact plugs and a plurality of dummy contact plugs passing through the insulating layer;
    a plurality of upper interconnections on the insulating layer; and
    a plurality of lower interconnections on the insulating layer, wherein
    the plurality of dummy contact plugs include a first dummy contact plug and a second dummy contact plug,
    the plurality of upper interconnections include a first upper interconnection overlapping the first dummy contact plug,
    the plurality of lower interconnections include a first lower interconnection underlapping the first dummy contact plug and a second lower interconnection underlapping the second dummy contact plug,
    a vertical central axis of the first dummy contact plug extending from a bottommost point of the first dummy contact plug is located outside the first upper interconnection and the first lower interconnection, the second dummy contact plug penetrates a portion of a sidewall of the second lower interconnection, the first upper interconnection and the first lower interconnection are in direct contact with the first dummy contact plug, the first dummy contact plug is not electrically active, the first upper interconnection is not electrically active, and a width of each upper portion of the plurality of main contact plugs and the plurality of dummy contact plugs is wider than a width of each lower portion of the plurality of main contact plugs and the plurality of dummy contact plugs.

2. The semiconductor device of claim 1, wherein an overlapping area of the first dummy contact plug and the upper interconnection is less than 0.5 times an area of an upper surface of the first dummy contact plug.

3. The semiconductor device of claim 1, wherein an interface between the first dummy contact plug and the upper interconnection is at a lower level than an upper surface of the insulating layer.

4. The semiconductor device of claim 1, wherein upper surfaces of the plurality of main contact plugs and the plurality of dummy contact plugs are at a lower level than an upper end of the insulating layer.

5. The semiconductor device of claim 1, wherein an interface between the first dummy contact plug and the first upper interconnection is substantially coplanar with an upper surface of the insulating layer.

6. The semiconductor device of claim 1, wherein each of the plurality of upper interconnections includes an upper conductive layer and an upper barrier layer configured to surround side surfaces and lower portions of the upper conductive layer, and the upper barrier layer is formed between the upper conductive layer and the first dummy contact plug.

7. The semiconductor device of claim 1, wherein
the second dummy contact plug is spaced apart from the plurality of upper interconnections.

8. The semiconductor device of claim 1,
wherein the vertical central axis of the first dummy contact plug is located outside the first lower interconnection.

9. The semiconductor device of claim 1, wherein
the plurality of dummy contact plugs include a third dummy contact plug,
the plurality of lower interconnections include a third lower interconnection pattern underlapping the third dummy contact plug, and
a vertical central axis of the third dummy contact plug is located outside the third lower interconnection.

10. The semiconductor device of claim 1 wherein
the plurality of dummy contact plugs include a fourth dummy contact plug,
the plurality of upper interconnections include an upper dummy interconnection, and
a vertical central axis of the fourth dummy contact plug overlaps the lower dummy interconnection and the upper dummy interconnection.

11. The semiconductor device of claim 8, wherein,
a point at which the first upper interconnection is in direct physical contact with the first dummy contact plug is located outside of the vertical central axis of the first dummy contact plug, a point at which the first dummy contact plug is in direct physical contact with the first lower interconnections is located outside of the vertical central axis of the first dummy contact plug, and the first dummy contact plug is symmetric about the vertical central axis.

12. A semiconductor device comprising:
a first insulating layer on a substrate;
a plurality of lower interconnections inside the first insulating layer;
an etch stop layer on the first insulating layer and the plurality of lower interconnections;
a second insulating layer on the etch stop layer;
a plurality of main contact plugs and a plurality of dummy contact plugs passing through the second insulating layer and the etch stop layer; and
a plurality of upper interconnections on the second insulating layer, wherein
the plurality of dummy contact plugs include a first dummy contact plug and a second dummy contact plug,
the plurality of upper interconnections include a first upper interconnection overlapping and directly contacting the first dummy contact plug,
the plurality of lower interconnections include a first lower interconnection underlapping and directly contacting the second dummy contact plug,
a vertical central axis of the first dummy contact plug extending from a bottommost point of the first dummy contact plug is located outside the first upper interconnection,
a vertical central axis of the second dummy contact plug extending from a bottommost point of the second dummy contact plug is located outside the first lower interconnection,
the second dummy contact plug penetrates a portion of a sidewall of the first lower interconnection,
the first dummy contact plug is not electrically active,
the first upper interconnection is not electrically active, and
a width of each upper portion of the plurality of main contact plugs and the plurality of dummy contact plugs is wider than a width of each lower portion of the plurality of main contact plugs and the plurality of dummy contact plugs.

13. The semiconductor device of claim 12, wherein the etch stop layer includes:
a first etch stop layer on the first insulating layer and the plurality of lower interconnections;
a second etch stop layer on the first etch stop layer, and
a third etch stop layer on the second etch stop layer, wherein
the third etch stop layer including a material having etch selectivity with respect to the second insulating layer,
the second etch stop layer including a material having etch selectivity with respect to the third etch stop layer, and
the first etch stop layer including a material having etch selectivity with respect to the second etch stop layer and the plurality of lower interconnections.

14. The semiconductor device of claim 13, wherein
the first etch stop layer includes AlN,
the second etch stop layer includes oxygen-doped SiC (ODC), and
the third etch stop layer includes at least one of AlOC, AlO, AlON.

15. The semiconductor device of claim 13, wherein
the second etch stop layer is between the first etch stop layer and the third etch stop layer, and
the second etch stop layer is thicker than at least one of the first etch stop layer or the third etch stop layer.

16. The semiconductor device of claim 12, wherein lower portions of the main contact plugs and the dummy contact plugs, which are adjacent to the etch stop layer, have narrower widths than upper portions of the main contact plugs and the dummy contact plugs.

17. The semiconductor device of claim 12, wherein the etch stop layer adjacent to lower portions of the main contact plugs and the dummy contact plugs has a stepped shape.

18. The semiconductor device of claim 12, wherein edges of the second insulating layer adjacent to upper ends of the main contact plugs and the dummy contact plugs are rounded.

19. The semiconductor device of claim 12, wherein
the plurality of lower interconnections include a first lower conductive pattern underlapping the first dummy contact plug, and
the vertical central axis of the first dummy contact plug is located outside the first lower conductive pattern.

20. A semiconductor device comprising:
a first insulating layer on a substrate;
a plurality of lower interconnections inside the first insulating layer;
a lower capping pattern on the plurality of lower interconnections, the lower capping pattern including cobalt;
an etch stop layer on the first insulating layer and the plurality of lower interconnections;
a second insulating layer on the etch stop layer;
a plurality of main contact plugs and a plurality of dummy contact plugs passing through the second insulating layer and the etch stop layer; and
a plurality of upper interconnections on the second insulating layer, wherein
the plurality of dummy contact plugs include a first dummy contact plug, a second dummy contact plug, and a third dummy contact plug,
the plurality of upper interconnections include a first upper interconnection overlapping and directly contacting the first dummy contact plug, the plurality of upper interconnections include a second upper interconnection overlapping and directly contacting the third dummy contact plug,
the plurality of lower interconnections include a first lower interconnection underlapping and directly contacting the first dummy contact plug,
the plurality of lower interconnections include a second lower interconnection underlapping and directly contacting the second dummy contact plug,
the second dummy contact plug is not in contact with the plurality of upper interconnections and penetrates a portion of a sidewall of the second lower interconnection,
the third dummy contact plug is not in contact with the plurality of lower interconnections,
the etch stop layer includes a first etch stop layer on the first insulating layer and the plurality of lower interconnections, a second etch stop layer on the first etch stop layer; and third etch stop layer on the second etch stop layer,
the third etch stop layer includes a material having etch selectivity with respect to the second insulating layer,
the second etch stop layer includes a material having etch selectivity with respect to the third etch stop layer,
the first etch stop layer includes a material having etch selectivity with respect to the second etch stop layer, the third etch stop layer, and the lower capping pattern on the plurality of lower interconnections, and
a width of each upper portion of the plurality of main contact plugs and the plurality of dummy contact plugs is wider than a width of each lower portion of the plurality of main contact plugs and the plurality of dummy contact plugs.

* * * * *